US012704737B2

(12) United States Patent
Haag et al.

(10) Patent No.: US 12,704,737 B2
(45) Date of Patent: Aug. 11, 2026

(54) COLOR NEUTRAL EMISSIVE DISPLAY WITH NOTCHED REFLECTIVE POLARIZER

(71) Applicant: 3M INNOVATIVE PROPERTIES COMPANY, St. Paul, MN (US)

(72) Inventors: Adam D. Haag, Woodbury, MN (US); Timothy J. Nevitt, Red Wing, MN (US); Martin E. Denker, Vadnais Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 1045 days.

(21) Appl. No.: 17/636,934

(22) PCT Filed: Sep. 24, 2020

(86) PCT No.: PCT/IB2020/058946
§ 371 (c)(1),
(2) Date: Feb. 21, 2022

(87) PCT Pub. No.: WO2021/059191
PCT Pub. Date: Apr. 1, 2021

(65) Prior Publication Data

US 2022/0357493 A1 Nov. 10, 2022

Related U.S. Application Data

(60) Provisional application No. 62/906,852, filed on Sep. 27, 2019.

(51) Int. Cl.

| | |
|---|---|
| ***G02B 27/28*** | (2006.01) |
| ***G02B 5/30*** | (2006.01) |
| ***H10K 59/80*** | (2023.01) |

(52) U.S. Cl.
CPC .......... *G02B 27/281* (2013.01); *G02B 5/305* (2013.01); *G02B 5/3083* (2013.01); *H10K 59/8791* (2023.02)

(58) Field of Classification Search
None
See application file for complete search history.

(56) References Cited

U.S. PATENT DOCUMENTS

| | | | |
|---|---|---|---|
| 6,300,991 | B1 | 10/2001 | Schadt |
| 10,185,068 | B2 | 1/2019 | Johnson |

(Continued)

FOREIGN PATENT DOCUMENTS

| | | |
|---|---|---|
| WO | WO 2019-204078 | 10/2019 |
| WO | WO 2020-051874 | 3/2020 |

OTHER PUBLICATIONS

International Search Report for PCT International Application No. PCT/IB2020/058946, mailed on Dec. 14, 2020, 4 pages.

*Primary Examiner* — William R Alexander
*Assistant Examiner* — Mackenzi Bourquine
(74) *Attorney, Agent, or Firm* — Theresa Stadheim

(57) ABSTRACT

A display system is disclosed and includes a display and a reflective polarizer disposed on the display. For substantially normally incident light, for a primary wavelength $\lambda_b$, the reflective polarizer transmits at least 60% of the incident light having a first polarization state x and reflects at least 60% of the incident light having an orthogonal second polarization state y. For each of a first wavelength $\lambda_{uv}$ and a second wavelength $\lambda_{bg}$, $0<\lambda_b-\lambda_{uv}\leq 100$ nm#and $0<\lambda_{bg}-\lambda_b\leq 100$ nm, the reflective polarizer transmits at least 40% of the incident light for each of the first and second polarization states.

13 Claims, 27 Drawing Sheets

(56) References Cited

U.S. PATENT DOCUMENTS

| | | | | |
|---|---|---|---|---|
| 2002/0180916 | A1 | 12/2002 | Schadt | |
| 2003/0028048 | A1 | 2/2003 | Cherkaoui | |
| 2005/0072959 | A1 | 4/2005 | Moia | |
| 2006/0197068 | A1 | 9/2006 | Schadt | |
| 2006/0286396 | A1* | 12/2006 | Jonza | B32B 27/308 428/480 |
| 2010/0177265 | A1 | 7/2010 | Jung | |
| 2012/0249935 | A1* | 10/2012 | Oya | B32B 27/36 359/488.01 |
| 2015/0099126 | A1* | 4/2015 | Honda | G02B 5/30 428/447 |
| 2015/0325813 | A1 | 11/2015 | Haag | |
| 2016/0118448 | A1 | 4/2016 | Epstein | |
| 2018/0107015 | A1* | 4/2018 | Dümpelmann | G02B 5/008 |
| 2018/0196275 | A1* | 7/2018 | Robinson | G02B 30/24 |
| 2019/0285939 | A1* | 9/2019 | Lee | G02B 17/086 |

* cited by examiner

COLOR NEUTRAL EMISSIVE DISPLAY WITH NOTCHED REFLECTIVE POLARIZER

CROSS REFERENCE TO RELATED APPLICATIONS

This application is a national stage filing under 35 U.S.C. 371 of PCT/IB2020/058946, filed Sep. 24, 2020, which claims the benefit of Provisional Application No. 62/906,852, filed Sep. 27, 2019, the disclosures of which are incorporated by reference in their entirety herein.

BACKGROUND

Reflective films including multiple polymeric layers are known. Examples of such films are mirrors and polarizers which include alternating polymeric layers in which the adjacent layers have different refractive indices.

Displays may exhibit variable black state reflectivity properties.

SUMMARY

In some aspects of the present disclosure, a display system is provided. The display system can include a display including a plurality of pixels and configured to emit an image for viewing by a viewer and a reflective polarizer disposed on the display. For substantially normally incident light, for a primary wavelength $\lambda_b$, the reflective polarizer can transmit at least 60% of the incident light having a first polarization state x and reflect at least 60% of the incident light having an orthogonal second polarization state y, and for each of a first wavelength $\lambda_{uv}$ and a second wavelength $\lambda_{bg}$, $0<\lambda_b-\lambda_{uv}\leq 100$ nm and $0<\lambda_{bg}-\lambda_b\leq 100$ nm, the reflective polarizer can transmit at least 40% of the incident light for each of the first and second polarization states. The display system can also include a retarder layer disposed between the reflective polarizer and the display, such that when a substantially white incident light is incident on the display system at an incident angle θ1, the display system reflects at least a portion of the incident light, after the incident light is reflected at least twice by the display as an exiting light propagating at an exit angle θ2 substantially equal to the incident angle, and a maximum difference between corresponding CIE 1931 color chromaticity coordinates x and y of the incident and exiting lights can be less than about 0.1 at least when the incident angle is substantially equal to zero.

In some aspects of the present disclosure, a display system is provided. The display system can include a display configured to emit an image in a visible wavelength range, and the display can include a blue pixel configured to emit blue light. The emitted blue light can have a blue peak at a blue wavelength $\lambda_b$ in the visible wavelength range. The display system can also include a linear absorbing polarizer layer disposed on the display, a reflective polarizer disposed between the linear absorbing polarizer layer and the display, and a retarder layer disposed between the reflective polarizer and the display and having a deviation Δ from being a quarter-wave retarder. For a substantially normally incident light: for the blue wavelength $\lambda_b$, the reflective polarizer can transmit at least 60% of light having a first polarization state and reflect at least 60% of light having an orthogonal second polarization state, for at least one wavelength less than $\lambda_b$, $\lambda_b-\lambda_{uv}\leq 50$ nm, and for each wavelength λ in the visible wavelength range, $\lambda-\lambda_b\geq 50$ nm, the reflective polarizer can transmit at least 40% of the incident light for each of the first and second polarization states. Δ can be $\Delta_b$ at the wavelength $\lambda_b$, and $\Delta_r$ at at least one red wavelength $\lambda_r$ in the visible wavelength range, $\lambda_r-\lambda_b\geq 100$ nm, $\Delta_b\leq\Delta_r$, and for the first polarization state, the linear absorbing polarizer can have a greater transmittance at the red wavelength $\lambda_r$ than at the blue wavelength $\lambda_b$.

In some aspects of the present disclosure, a display system is provided. The display system can include an emissive display including a blue pixel configured to emit blue light having a blue peak at a blue wavelength $\lambda_b$, a green pixel configured to emit green light having a green peak at a green wavelength $\lambda_g$, and a red pixel configured to emit red light having a red peak at a red wavelength $\lambda_r$. The display system can also include a reflective polarizer disposed on the emissive display and a retarder layer disposed between the reflective polarizer and the emissive display and having a deviation Δ from being a quarter-wave retarder. For a substantially normally incident light: for the blue wavelength $\lambda_b$ and for at least one infrared wavelength $\lambda_{ir}$, the reflective polarizer transmits at least 60% of light having a first polarization state and reflects at least 60% of light having an orthogonal second polarization state, for each of the green and red wavelengths $\lambda_g$ and $\lambda_r$, the reflective polarizer transmits at least 40% of the incident light for each of the first and second polarization states, and Δ is $\alpha_b$ and $\alpha_r$ at the respective blue and red wavelengths $\lambda_r$, and $\lambda_r$, $\Delta_b\leq\Delta_r$. For light incident at at least one incident angle between about 10 and 60 degrees, and for the red wavelength $\lambda_r$, the reflective polarizer can transmit at least 50% of light having the first polarization state and reflect at least 50% of light having the second polarization state.

Figure 15:
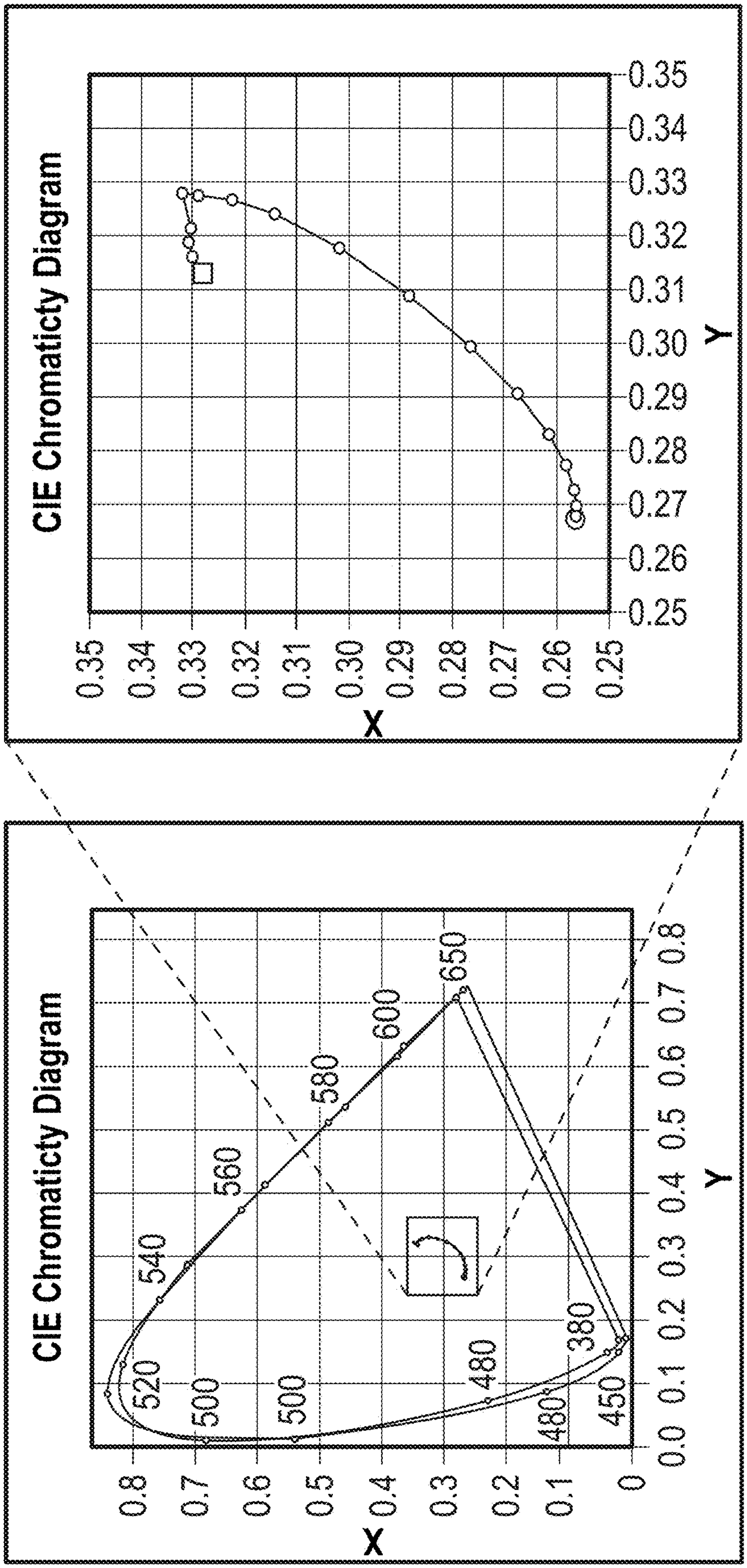
Figure 16:
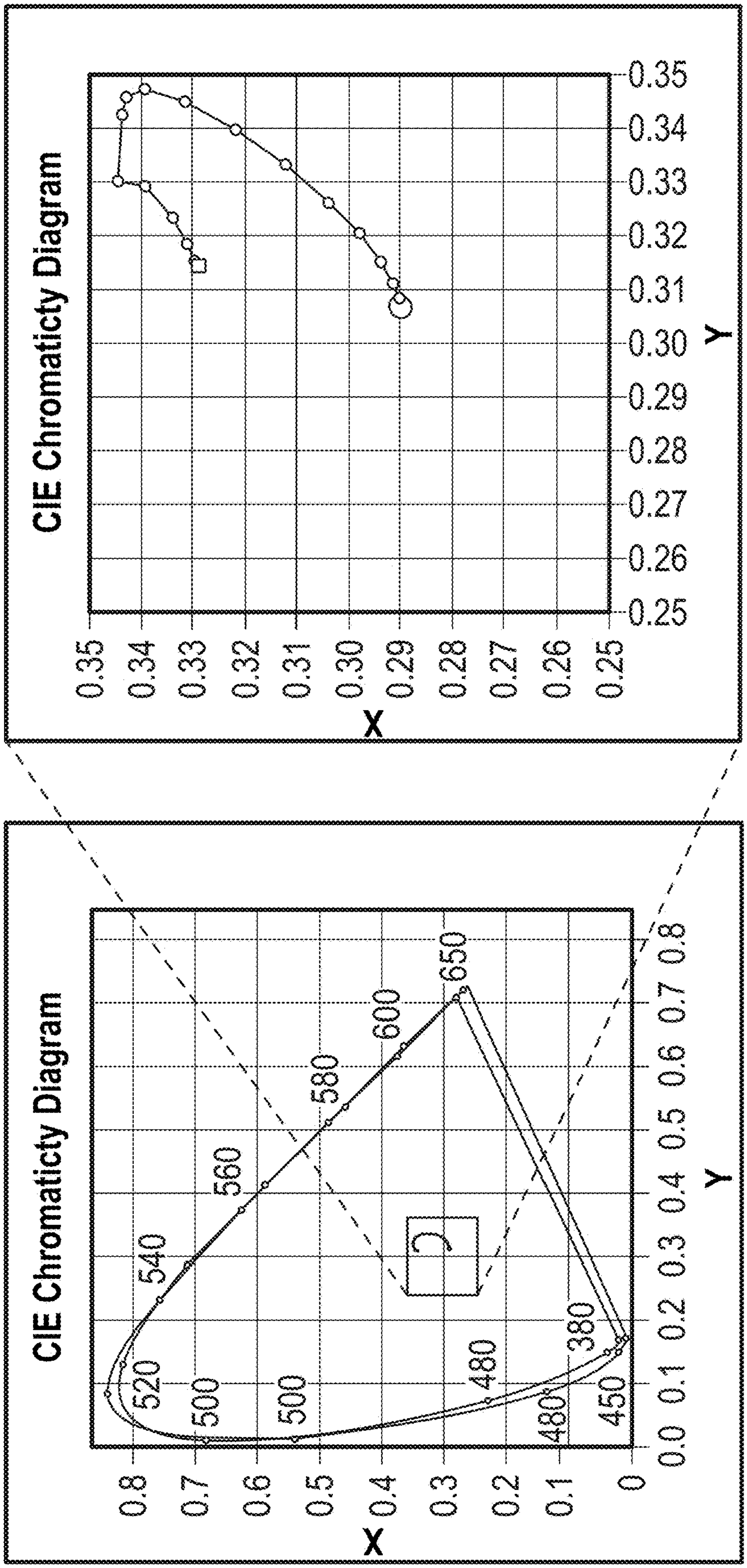
Figure 17:
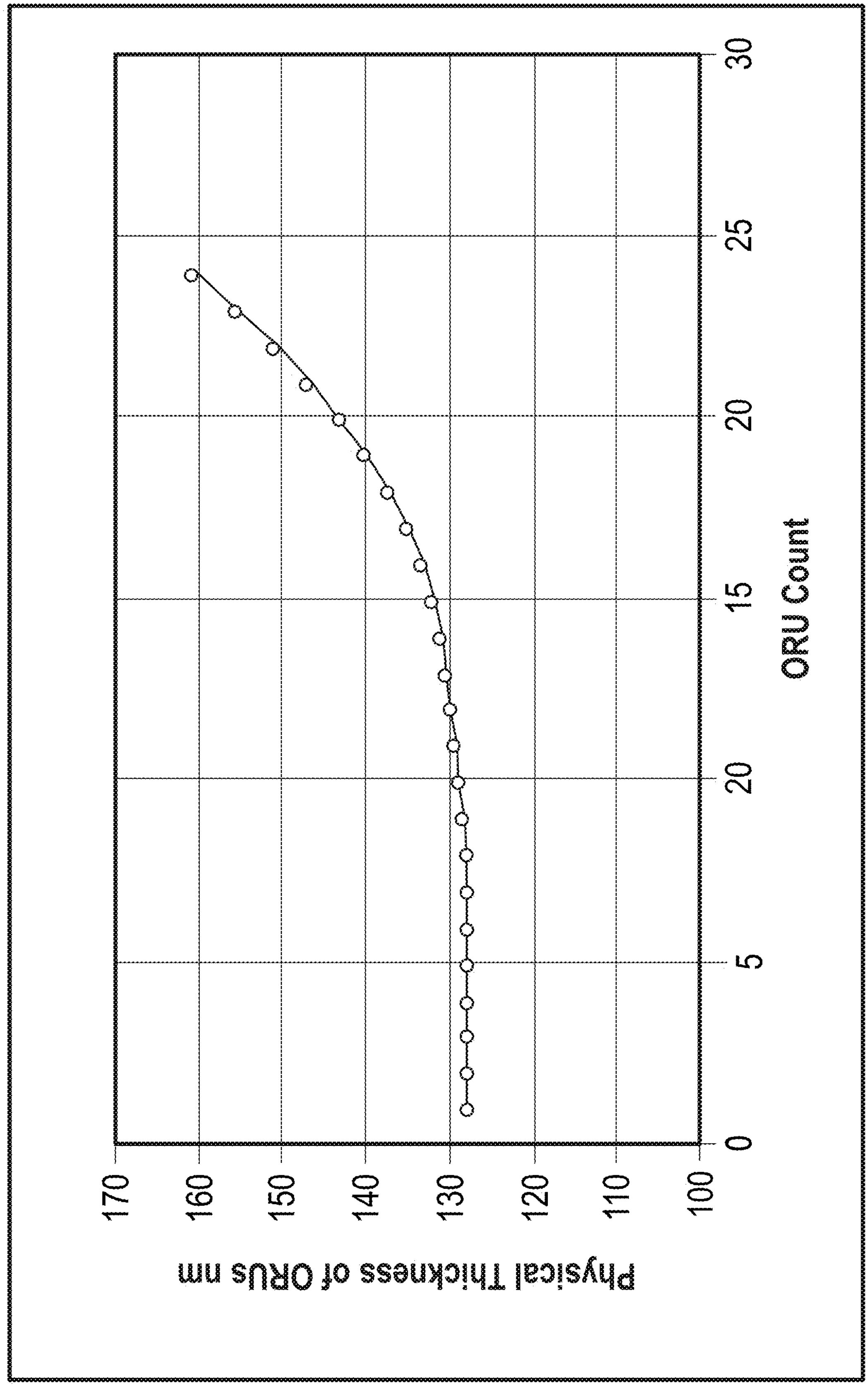
Figure 18:
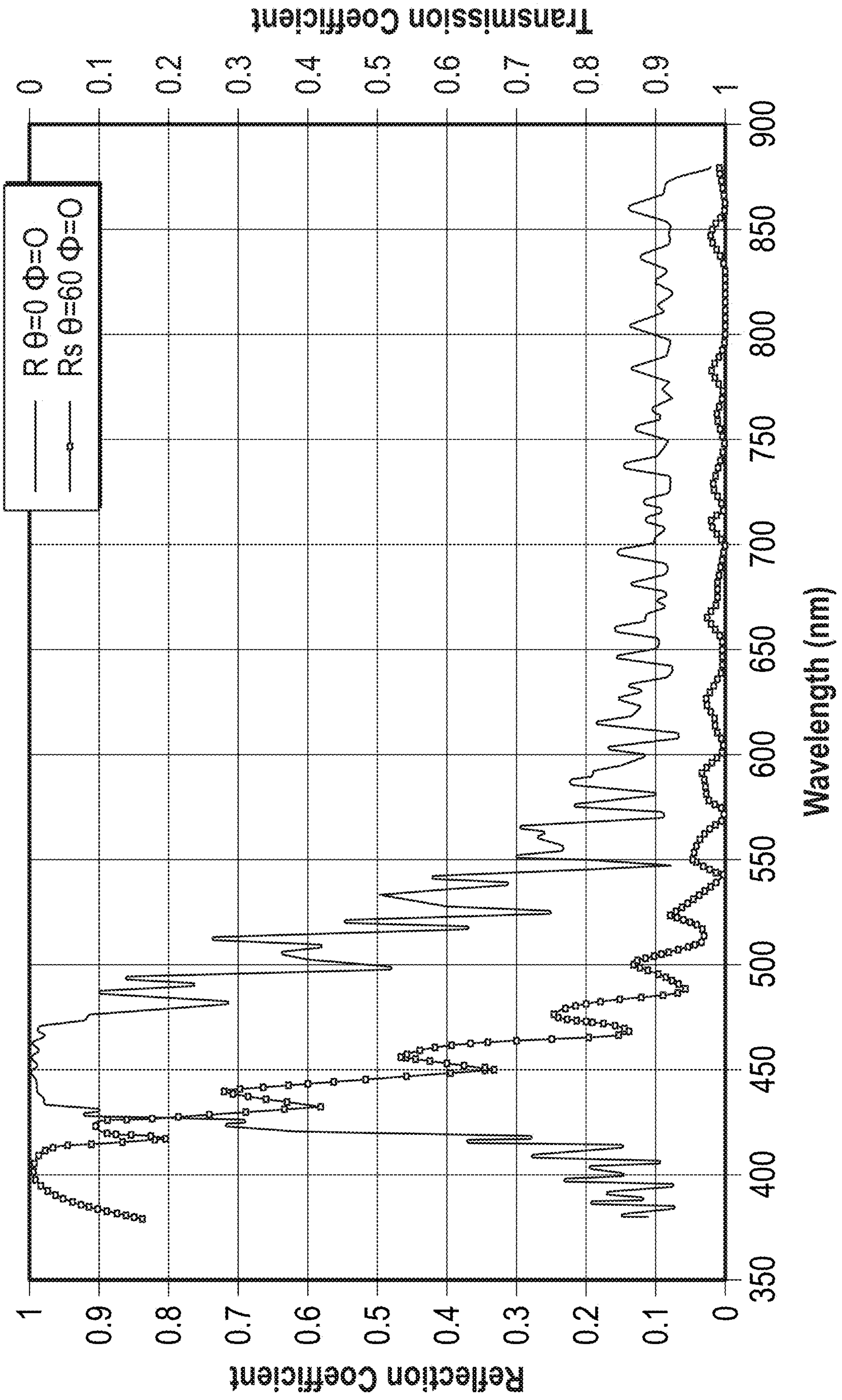
Figure 19:
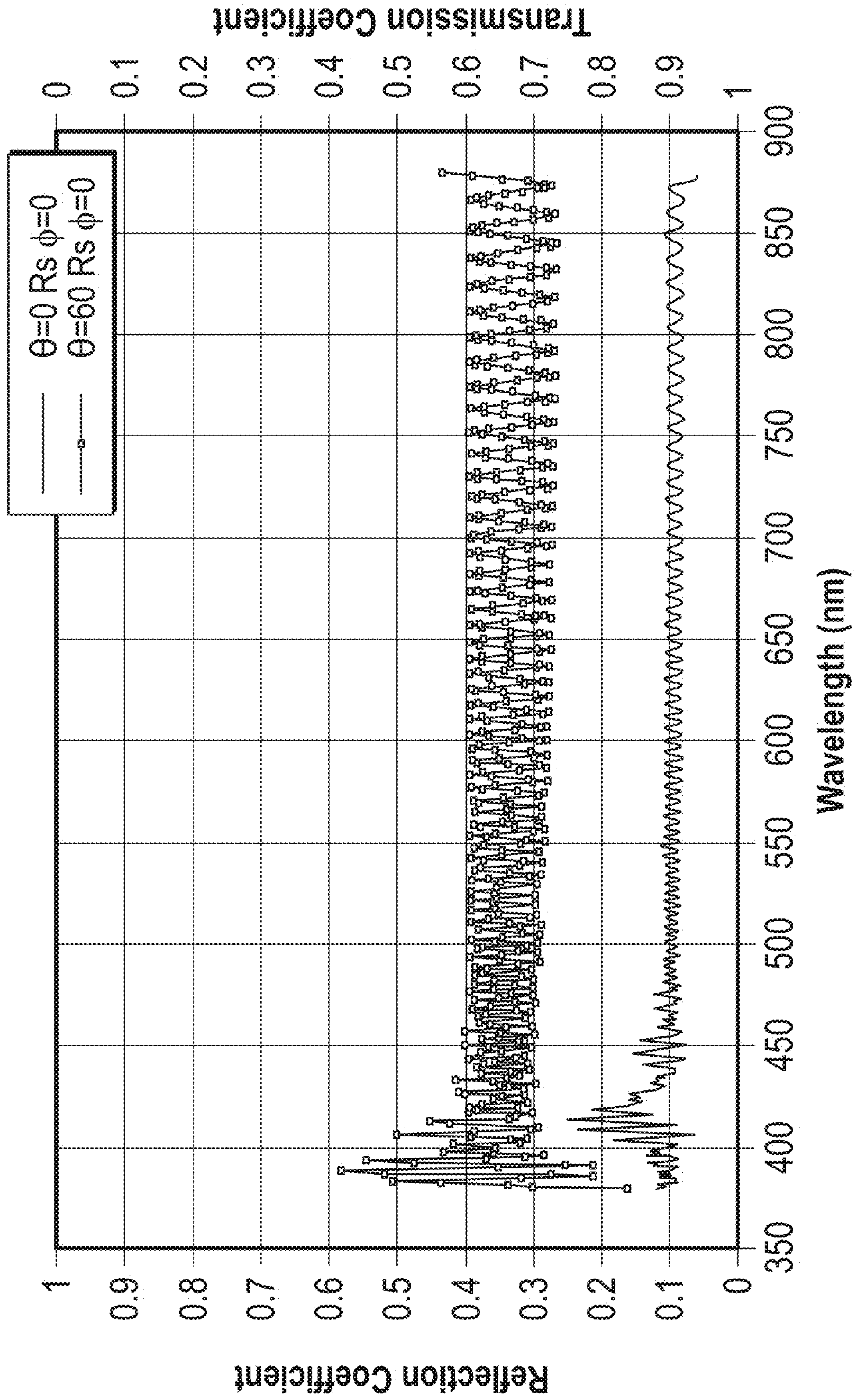
Figure 20:
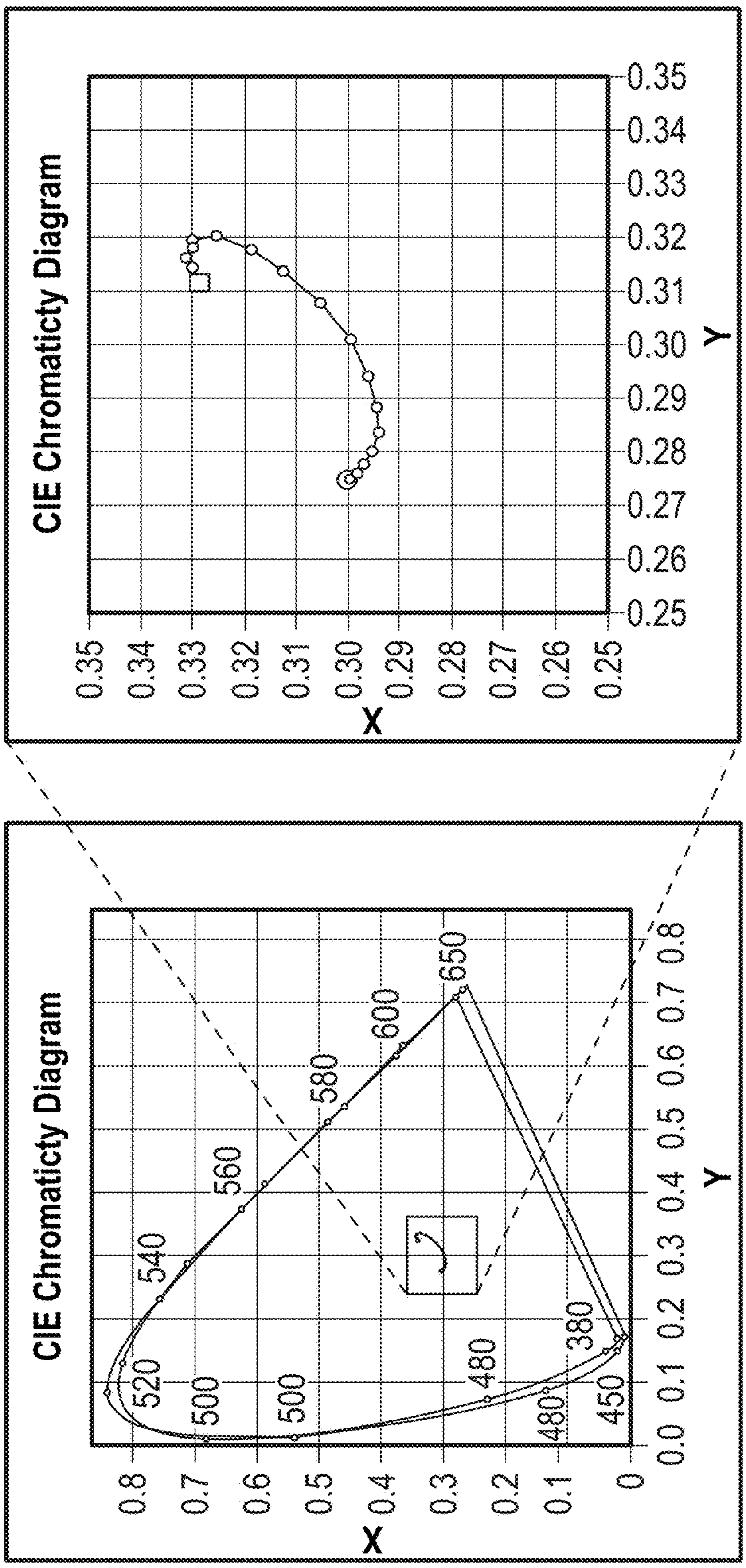
Figure 21:
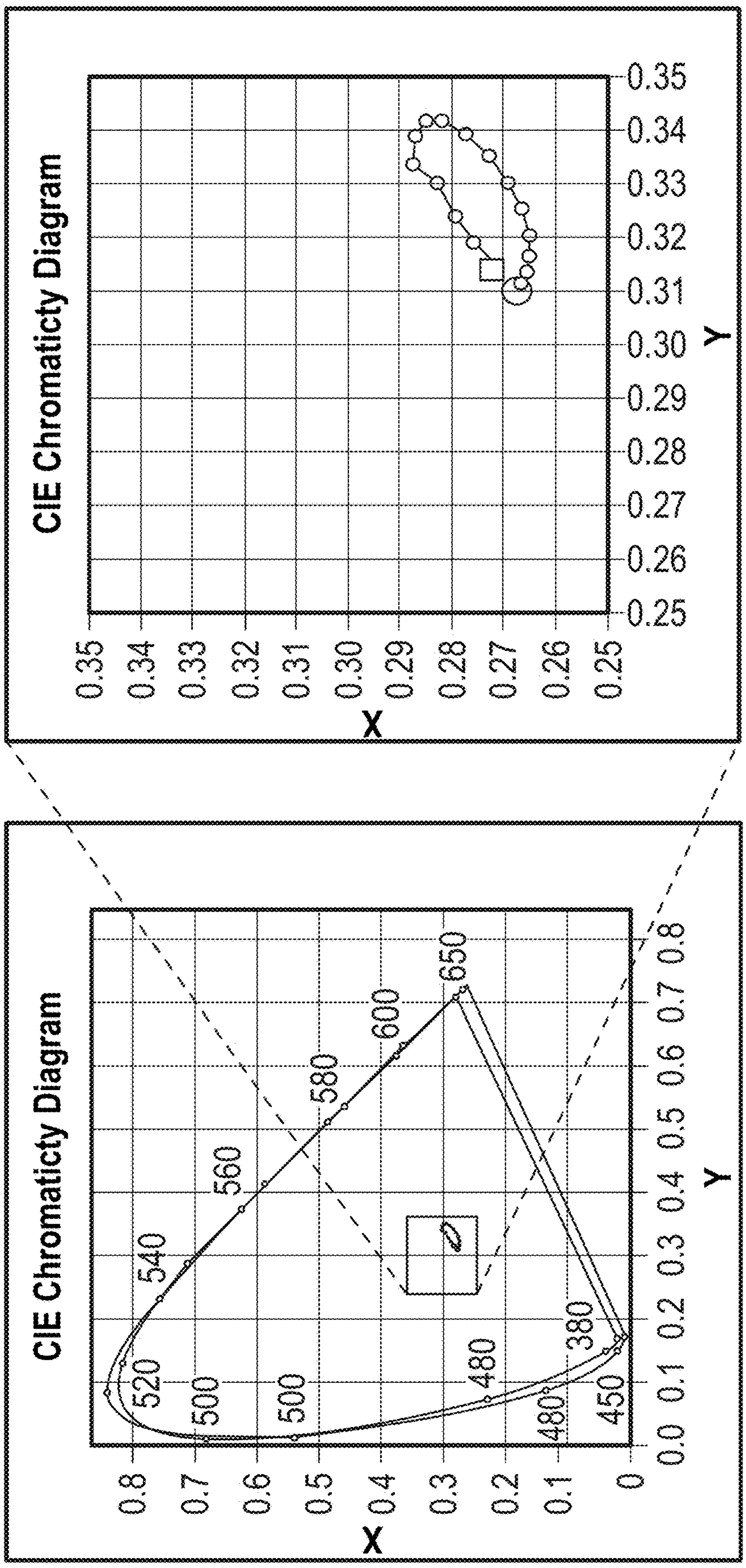
Figure 22:
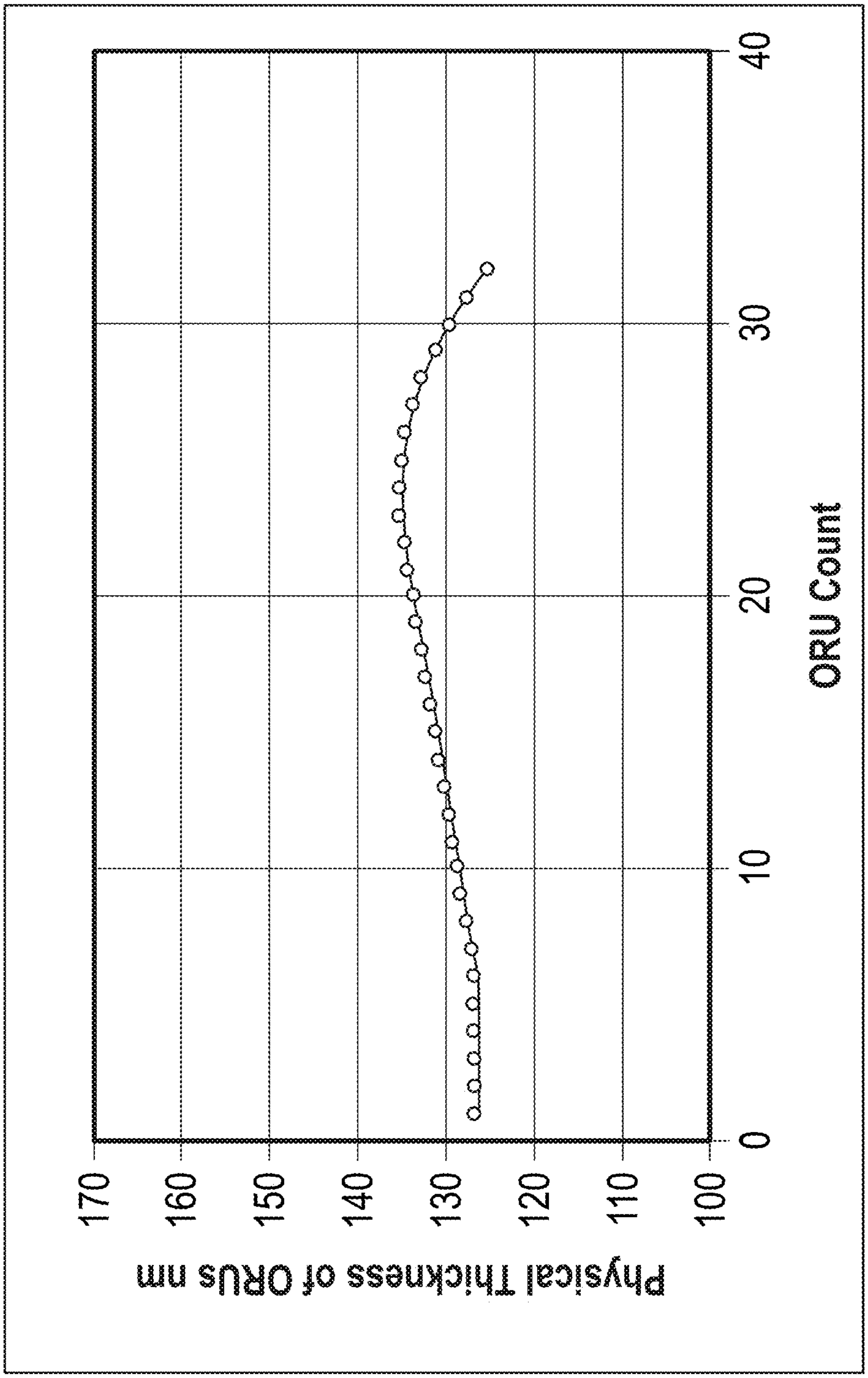
Figure 23:
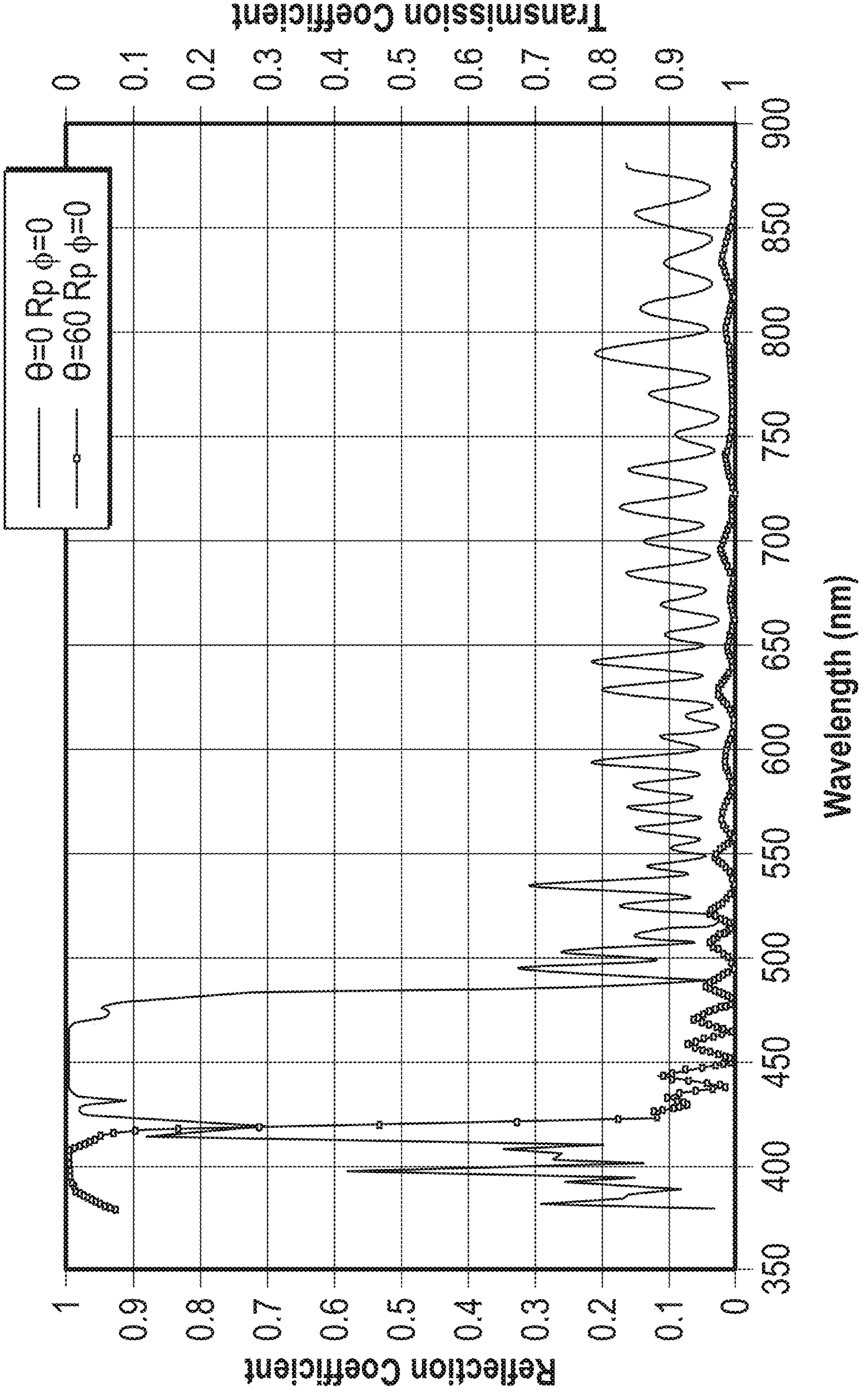
Figure 24:
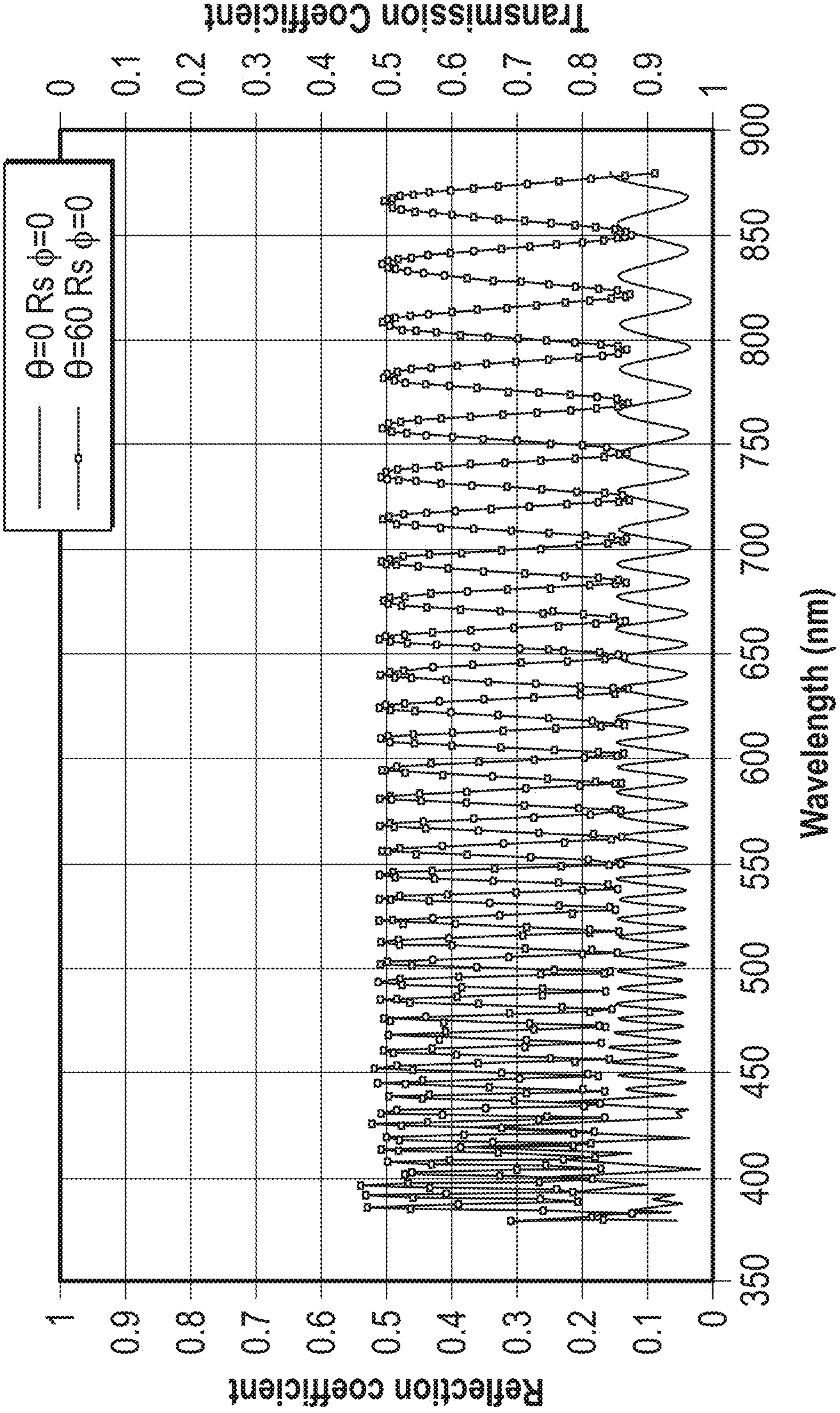
Figure 25:
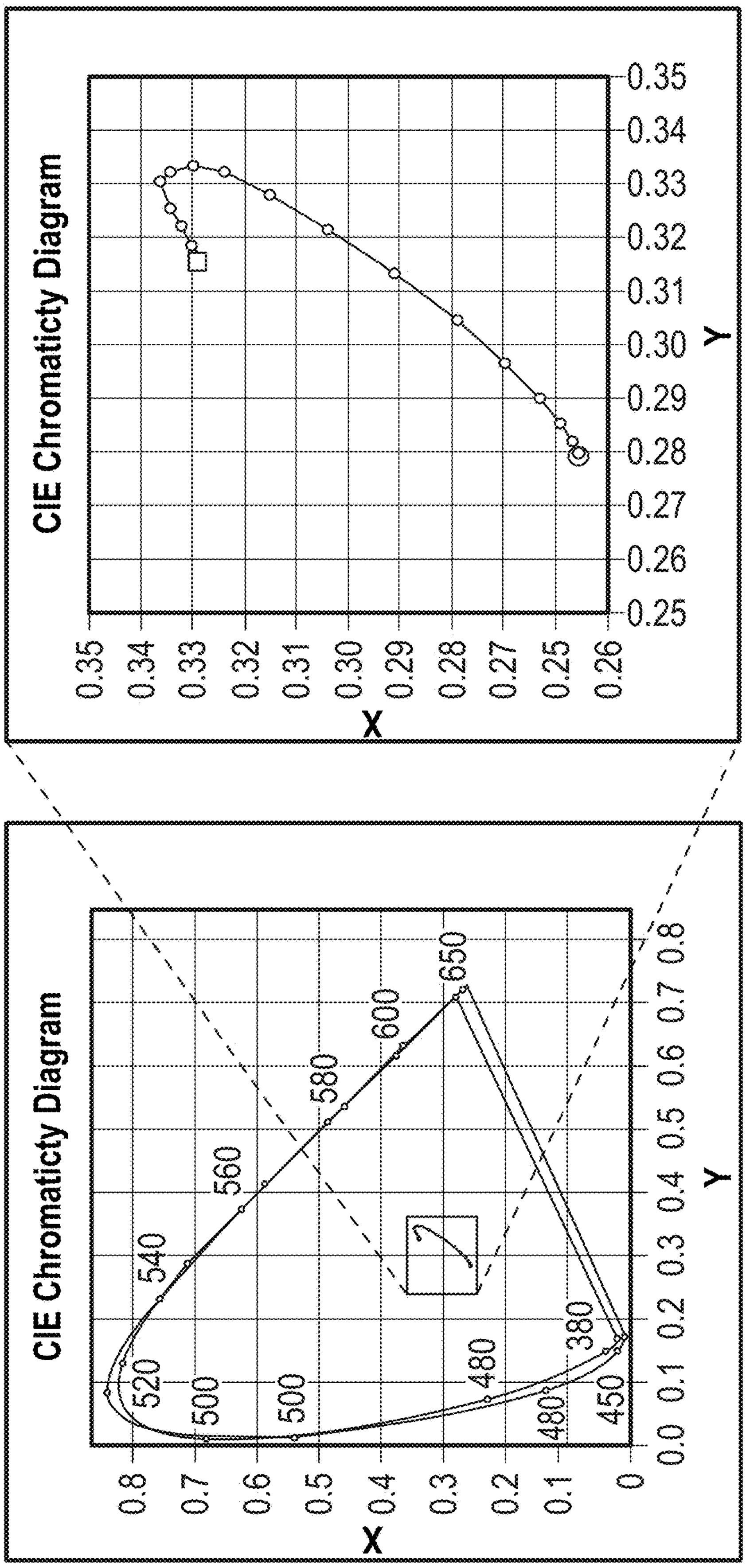
Figure 26:
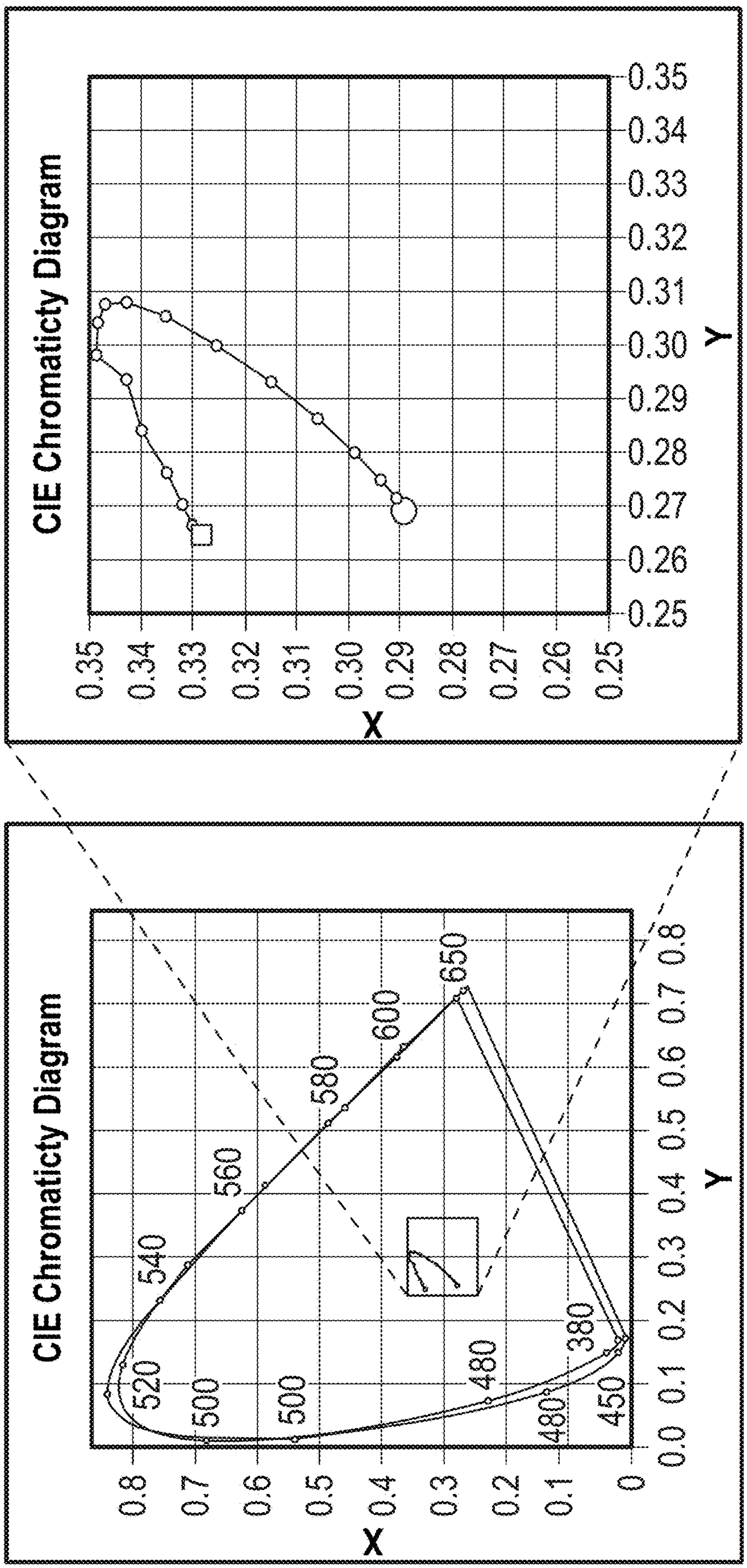
Figure 27:
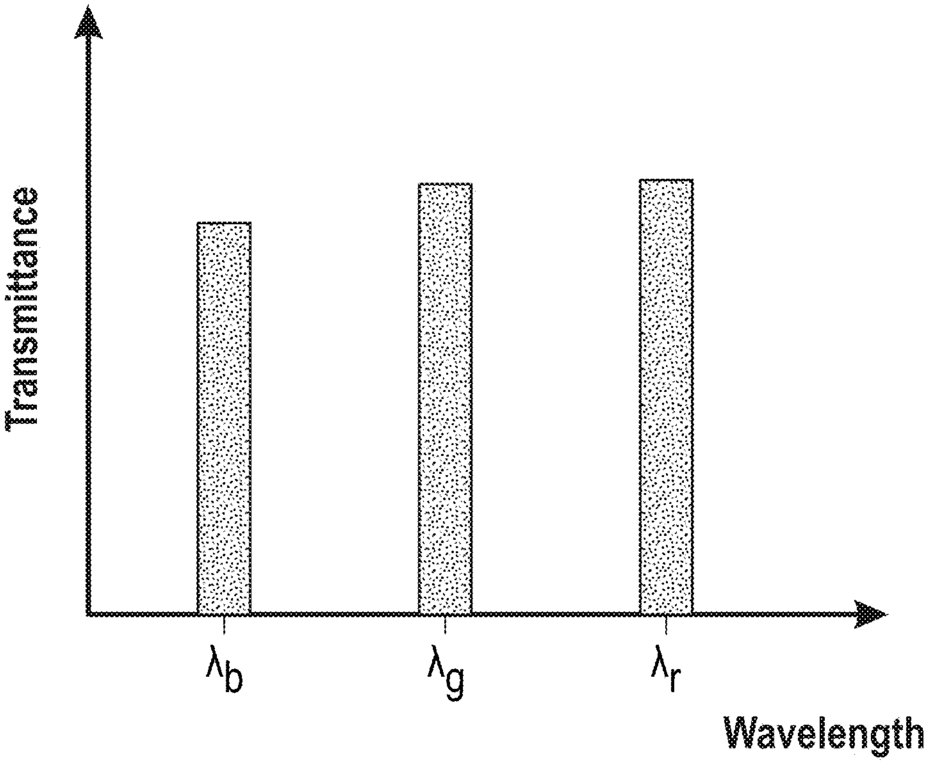

for the second reflective polarizer for normal incidence and for a 60 degree angle of incidence;

FIGS. 15-16 are chromaticity plots for ambient reflection from circular polarizers incorporating the second reflective polarizer for varying angle of incidence;

FIG. 17 is a plot of a thickness profile of optical repeat units in a third reflective polarizer;

FIGS. 18-19 are plots of reflection coefficients (left vertical axis) and transmission coefficients (right vertical axis) for the second reflective polarizer for normal incidence and for a 60 degree angle of incidence;

FIGS. 20-21 are chromaticity plots for ambient reflection from circular polarizers incorporating the third reflective polarizer for varying angle of incidence;

FIG. 22 is a plot of a thickness profile of optical repeat units in a fourth reflective polarizer;

FIGS. 23-24 are plots of reflection coefficients (left vertical axis) and transmission coefficients (right vertical axis) for the fourth reflective polarizer for normal incidence and for a 60 degree angle of incidence;

FIGS. 25-26 are chromaticity plots for ambient reflection from circular polarizers incorporating the fourth reflective polarizer for varying angle of incidence;

FIG. 27 is a schematic plot of transmittance of a linear absorbing polarizer for a first polarization state for blue, green, and red wavelengths.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Wavelength and polarization dependent partial reflectors can be useful for improving reflected color properties, or black state properties, of an emissive display when the partial reflector is used in a circular polarizer of the emissive display. The partial reflectors may be reflective polarizers since the partial reflectors, in some embodiments, have different reflection properties for two orthogonal polarization states. The partial reflectors may be birefringent multilayer optical films with controlled band edges and tailored reflectivity with incidence angle.

Figure 1:
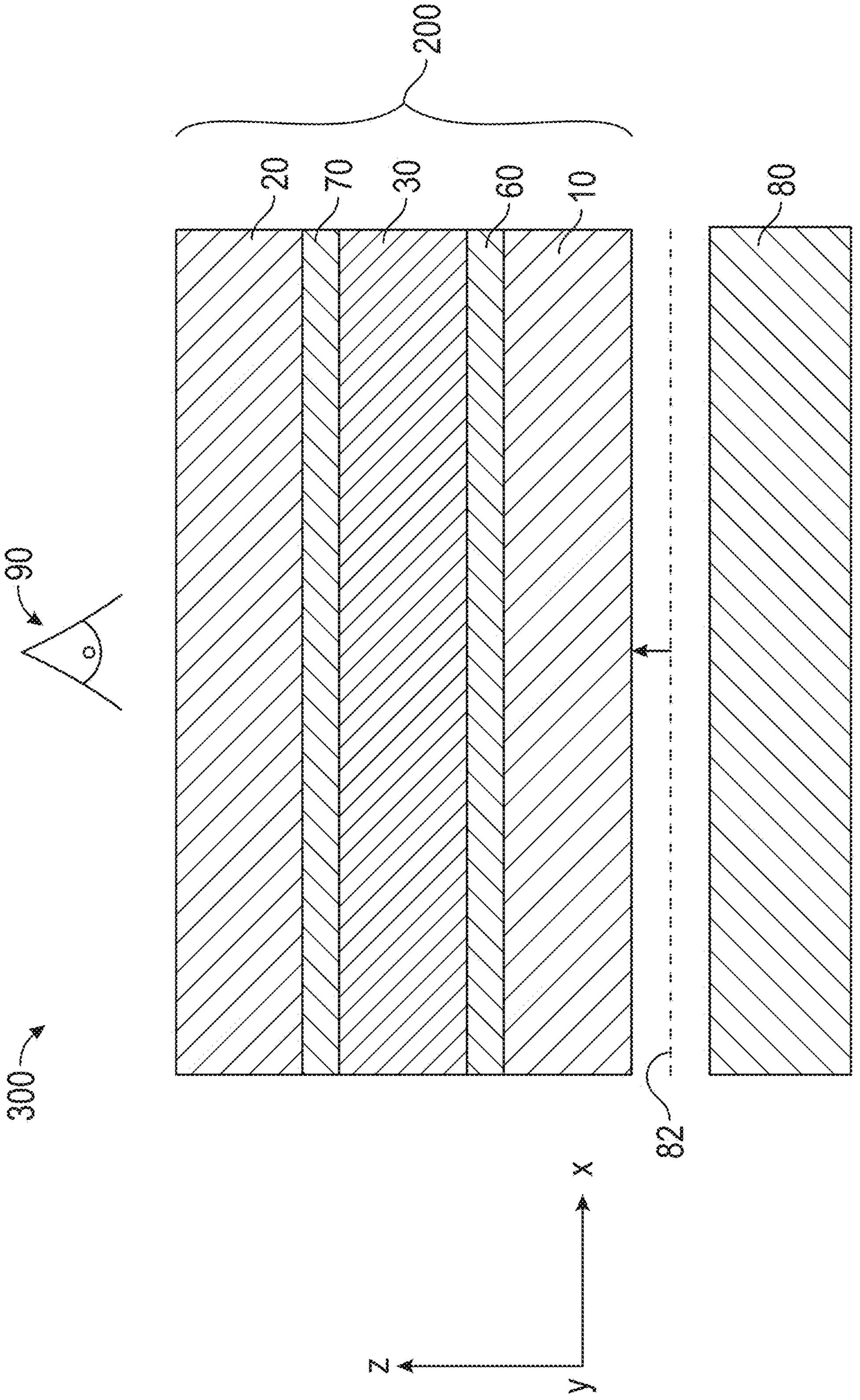
FIG. 1 is a schematic perspective view of a display system according to exemplary embodiments of the present disclosure.

FIG. 1 is a schematic cross-sectional view of an optical stack 200 and a display 300. The display 300 can be an emissive display, and more specifically can exemplarily be an Organic Light-Emitting Diode (OLED) backplane layer or a Micro Light-Emitting Diode (μLED) backplane layer.

In some embodiments, the optical stack 200 includes a plurality of elements in optical communication with each other including, but not limited to, a retarder layer 10, a linear absorbing polarizer 20 and a reflective polarizer 30. The reflective polarizer 30 can be disposed between, or substantially between, the linear absorbing polarizer 20 and the retarder layer 10. The reflective polarizer 30 can be bonded to the retarder layer 10 by a first adhesive layer 60 and the reflective polarizer 30 can be bonded to the linear absorbing polarizer 30 by a second adhesive layer 70.

One or both of the first adhesive layer 60 and the second adhesive layer 70 may be an optically clear adhesive (e.g., an adhesive having a haze as determined by the ASTM D1003-13 standard, for example, of less than about 5%, or less than about 2%, and a luminous transmittance as determined by the ASTM D1003-13 standard, for example, of at least about 80% or at least about 90%). In some embodiments, one or both of the first adhesive layer 60 and second adhesive layer 70 may include pressure-sensitive adhesives, UV-curable adhesives and/or polyvinyl alcohol-type adhesives.

The reflective polarizer 30 can be a multilayer optical film that includes an optical stack having a plurality of optical repeat units. Each optical repeat unit can include a plurality of polymer layers, such as first and second polymer layers. The multilayer optical film can include individual microlayers, where "microlayers" refer to layers sufficiently thin such that light reflected and/or transmitted at interfaces between such layers is primarily due to constructive or destructive interference to give the multilayer optical film desired reflective or transmissive properties. The microlayers can together represent one optical repeat unit (ORU) of the multilayer stack, an ORU being the smallest set of layers that recur in a repeating pattern throughout the thickness of the stack. The microlayers can have different refractive index characteristics so that some light is reflected at interfaces between adjacent microlayers. For optical films designed to reflect light at ultraviolet, visible, or near-infrared wavelengths, each microlayer typically has an optical thickness (i.e., a physical thickness multiplied by the relevant refractive index) of less than about 1 micrometer. In some cases, each microlayer has an optical thickness that is substantially equal to about ¼ of a corresponding wavelength. Thicker layers can, however, also be included, such as skin layers at the outer surfaces of the film, or protective boundary layers (PBL) disposed within the film that, for example, separate packets of microlayers. In some embodiments, only a single packet or stack of microlayers is included in a given optical film.

The linear absorbing polarizer 20 of the present disclosure can substantially transmit light having one polarization state, while substantially absorbing light having an orthogonal polarization state. One useful type of linear absorptive polarizer 20 is a dichroic polarizer. Dichroic polarizers are made, for example, by incorporating a dye into a polymer sheet that is then stretched in one direction. Dichroic polarizers can also be made by uniaxially stretching a semicrystalline polymer such as polyvinyl alcohol, then staining the polymer with an iodine complex or a dichroic dye, or by coating a polymer with an oriented dichroic dye. These polarizers often use polyvinyl alcohol as the polymer matrix for the dye. Dichroic polarizers generally have a large amount of absorption of light. In some embodiments, the linear absorbing polarizers are "weak" linear absorbing polarizers that have a contrast ratio (ratio of pass state transmission to block state transmission) of less than about 100:1, 10:1 or 5:1.

The retarder layer 10 can include films, coatings or a combination of films and coatings. Exemplary films include birefringent polymer film retarders, such as those available from Meadowlark Optics (Frederick, CO), for example. Exemplary coatings for forming a retarder layer include the linear photopolymerizable polymer (LPP) materials and the liquid crystal polymer (LCP) materials described in U.S. Pat. App. Pub. No. 2002/0180916 (Schadt et al.), U.S. Pat. App. Pub. No. 2003/028048 (Cherkaoui et al.), U.S. Pat. App. Pub. No. 2005/0072959 (Moia et al.) and U.S. Pat. App. Pub. No. 2006/0197068 (Schadt et al.), and in U.S. Pat. No. 6,300,991 (Schadt et al.). Suitable LPP materials include ROP-131 EXP 306 LPP and suitable LCP materials include ROF-5185 EXP 410 LCP, both available from ROLIC Technologies Ltd. (Allschwil, Switzerland).

Figure 3:
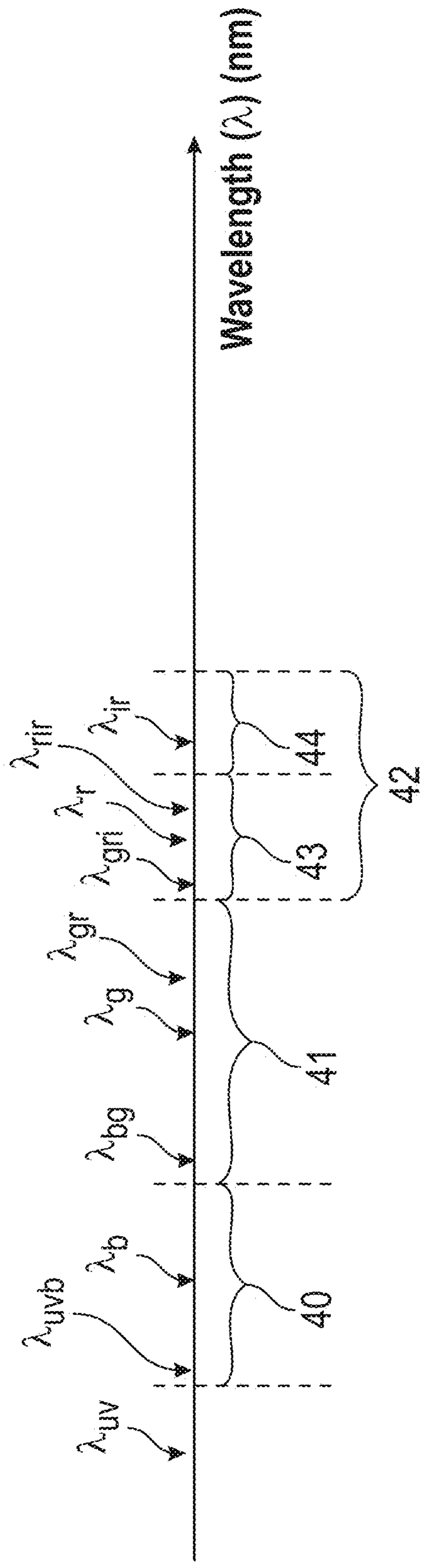
FIG. 3 is a schematic representation of a wavelength spectrum according to exemplary embodiments of the present disclosure.

FIG. 3 is a schematic representation of a wavelength spectrum, particularly indicating an exemplary blue wavelength range 40, which can range from about 425 nm to about 475 nm, an exemplary green wavelength range 41, which can range from about 525 nm to about 575 nm, and an exemplary red-infrared wavelength range 42, which can range from about 625 nm to about 800 nm. The red-infrared wavelength range 42 can be, in some embodiments, divided into a red wavelength range 43 and an infrared wavelength range 44. In some embodiments, the red-infrared wavelength range 42 is primarily a red wavelength range extending from about 625 nm to about 675 nm. These exemplary wavelength ranges (40, 41, 42, 43, 44) can also be seen in FIG. 4, as will be described below in further detail.

Figure 4:
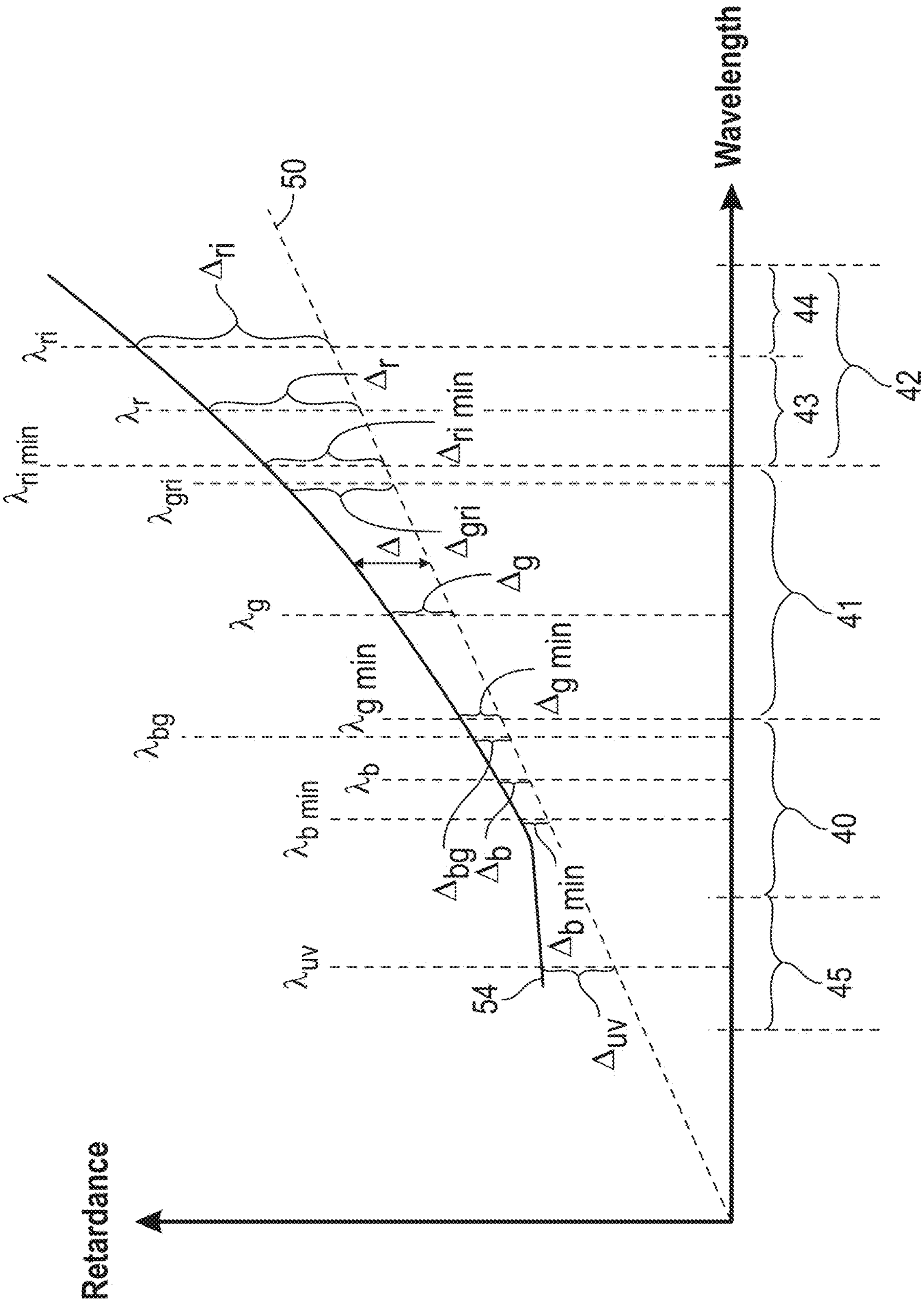
FIG. 4 is a plot of wavelength versus retardance, and in particular illustrating a quarter-wave relationship and a retarder layer relationship, according to exemplary embodiments of the present disclosure.

FIG. 4 is a plot of wavelength (X-axis) versus retardance (Y-axis). FIG. 4 illustrates a relationship between wavelength and retardance embodied by an ideal quarter-wave retarder, where wavelength and retardance vary linearly. For brevity and clarity, this relationship can be called a quarter-wave relationship 50. Also shown is an exemplary relationship between wavelength and retardance as embodied by the exemplary disclosed retarder layer 10. For brevity and clarity, this relationship can be called a retarder layer relationship 54. It can also be seen that a deviation Δ exists between the retarder layer relationship 54 and the quarter-wave relationship 50 at each given wavelength. In the exemplary plots of FIG. 4, the deviation Δ is non-zero at each wavelength in the wavelength ranges (40, 41, 42, 43, 44). In some embodiments, Δ may be zero or substantially zero at one or more wavelengths in the wavelength ranges (40, 41, 42, 43, 44).

Within the ultraviolet wavelength range 45, blue wavelength range 40, green wavelength range 41, red-infrared wavelength range 42, red wavelength range 43 and infrared wavelength range 44, respective ranges of deviations Δ can exist for different wavelengths λ. A deviation $\Delta_{b\ min}$ can be the minimum deviation at wavelength $\lambda_{b\ min}$ among the range of deviations Δ within the blue wavelength range 40. A deviation $\Delta_{g\ min}$ can be the minimum deviation at wavelength $\lambda_{g\ min}$ among the range of deviations Δ within the green wavelength range 41. A deviation $\Delta_{ri\ min}$ can be the minimum deviation at wavelength $\lambda_{ri\ min}$ among the range of deviations Δ within the red-infrared wavelength range 42. In some embodiments, the minimum $\Delta_{b\ min}$ value is less than one or both of minima $\Delta_{g\ min}$ and $\Delta_{ri\ min}$.

Figure 2:
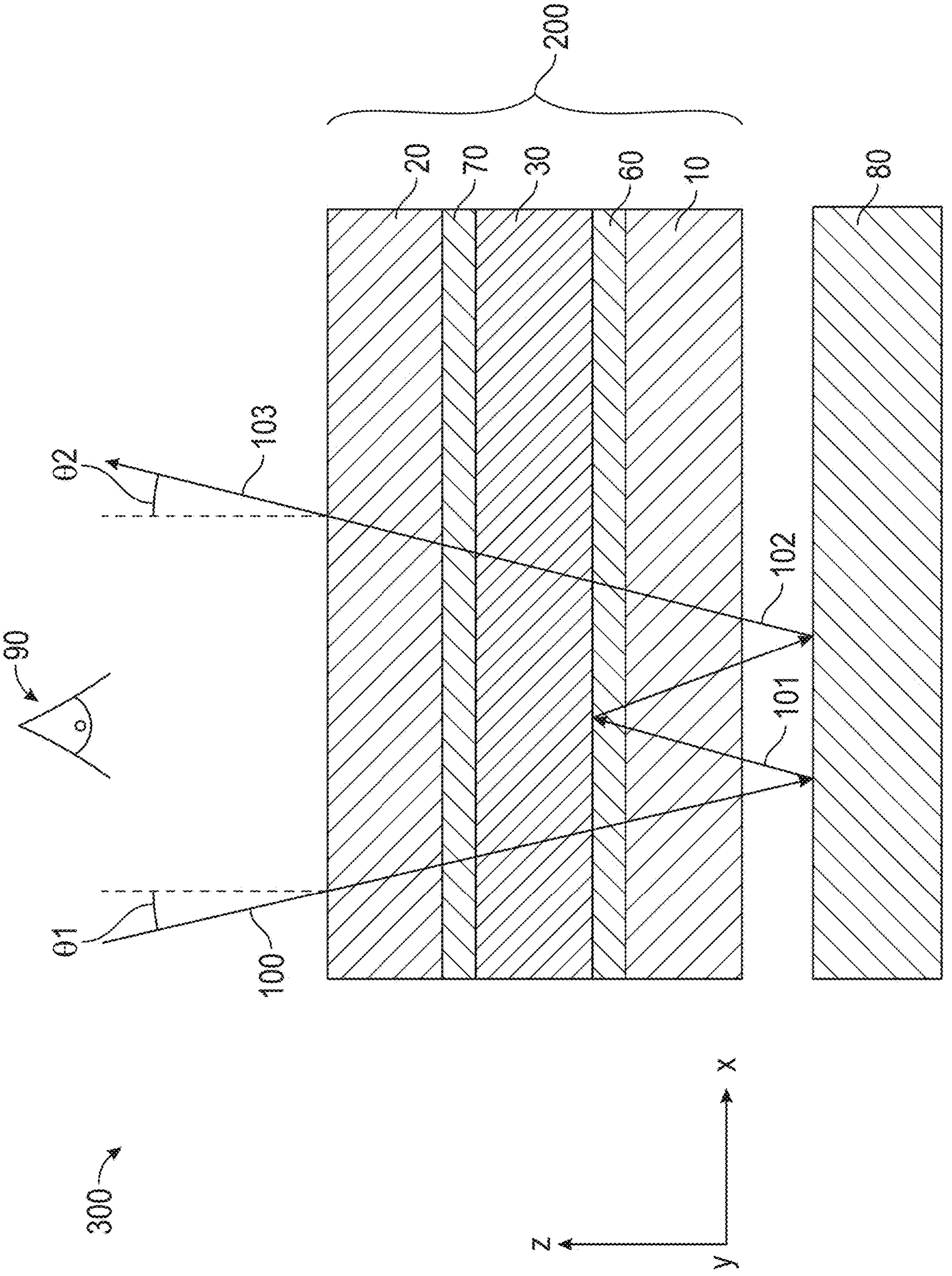
FIG. 2 is a schematic perspective view of a display system according to exemplary embodiments of the present disclosure, further showing various incident, reflected and exiting lights.

In some embodiments, the reflective polarizer 30 transmits a portion of substantially normal incident light having a first polarization state x at one or more of the wavelengths $\lambda_b$, $\lambda_g$ and $\lambda_{ri}$ within blue wavelength range 40, green wavelength range 41 and red-infrared wavelength range 42, respectively. In some embodiments, the first polarization state x can be substantially a linear polarization oriented along the x-axis, meaning that the electric field vector of light propagating along the z-axis is confined, or substantially confined, to the xz-plane. The reflective polarizer 30 can, in various implementations, transmit, transmit substantially, transmit about, or transmit at least 50%, 55%, 60%, 65%, 70%, 75%, 80%, 85%, 90% or 95% of substantially normal incident light having the first polarization state x at one or more of $\lambda_b$, $\lambda_g$ and $\lambda_{ri}$. While FIGS. 1 and 2 show the exemplary first polarization state x being of the linear form, it is to be understood that the first polarization state x can be of non-linear, circular, elliptical or any other polarized form.

In some embodiments, the reflective polarizer 30 reflects a portion of substantially normal incident light having a second polarization state y (orthogonal to the first polarization state x) at one or more of the wavelengths $\lambda_b$, $\lambda_g$ and $\lambda_{ri}$. In some embodiments, the second polarization state y can be substantially a linear polarization oriented along the y-axis, meaning that the electric field vector of light propagating along the z-axis is confined, or substantially confined, to the yz plane. The reflective polarizer 30 can, in various implementations, reflect, reflect substantially, reflect about, or reflect at least 50%, 55%, 60%, 65%, 70%, 75%, 80%, 85%, 90% or 95% of substantially normal incident light having the second polarization state y at one or more of $\lambda_b$, $\lambda_g$ and $\lambda_{ri}$.

In some embodiments, the reflective polarizer 30 transmits a portion of substantially normal incident light having the first polarization state x and/or the second polarization state y at one or more of $\lambda_{gri}$ and $\lambda_{bg}$. $\lambda_{gri}$ can be between $\lambda_g$ and $\lambda_{ri}$ while $\lambda_{bg}$ can be between $\lambda_g$ and $\lambda_b$. The reflective polarizer 30 can, in various implementations, transmit, transmit substantially, transmit about, or transmit at least 50%, 55%, 60%, 65%, 70%, 75%, 80%, 85%, 90% or 95% of substantially normal incident light having the first polarization state x and/or the second polarization state y at one or more of $\lambda_{gri}$ and $\lambda_{bg}$.

For substantially normally incident light, the linear absorbing polarizer layer 20 has an average transmittance $T_b$ across the blue wavelength range 40, an average transmittance $T_g$ across the green wavelength range 41 and an average transmittance $T_{ri}$ across the red-infrared wavelength range 42. In some embodiments, $T_b$ is less than one or both of $T_g$ and $T_{ri}$.

Turning to FIGS. 1 and 2, a display system 300 and a display 80 are shown. The display 80 can be divided into a plurality of light-gathering/generating picture elements, or pixels 81, as illustrated schematically in FIG. 5. The pixels 81 can be configured to emit an image 82 for viewing by a viewer 90. The reflective polarizer 30 can be in optical communication with the display 80 so that it is positioned to receive an image emitted by the display 80, and further can be disposed on, proximate or adjacent the display 80.

For an exemplary wavelength $\lambda_b$ within the blue wavelength range 40, the reflective polarizer can, in various implementations, transmit, transmit substantially, transmit about, or transmit at least 50%, 55%, 60%, 65%, 70%, 75%, 80%, 85%, 90% or 95% of substantially normal incident light having a first polarization state x. In some embodiments, for the exemplary wavelength $\lambda_b$, the reflective polarizer can, in various implementations, reflect, reflect substantially, reflect about, or reflect at least 50%, 55%, 60%, 65%, 70%, 75%, 80%, 85%, 90% or 95% of substantially normal incident light having a second polarization state y orthogonal, or substantially orthogonal, to the first polarization state x, wherein an angle between the polarization states x, y, can be less than 2, 4, 6, 8, 10 or 20 degrees.

A wavelength $\lambda_{uv}$ can be defined in an ultraviolet wavelength range 45 and a wavelength $\lambda_{bg}$ can be defined between wavelength $\lambda_b$ and $\lambda_g$ within wavelength range 40 or wavelength range 41. In various implementations, $0<\lambda_b-\lambda_{uv}\leq 80$, 85, 90, 95, 100, 105, 110, 115 or 120 nm and $0<\lambda_{bg}-\lambda_b\leq 80$, 85, 90, 95, 100, 105, 110, 115 or 120 nm and the reflective polarizer 30 transmits, transmits substantially, transmits about, or transmits at least 20%, 25%, 30%, 35%, 40%, 45%, 50%, 55%, 60% or 65% of substantially normal incident light for each of the first polarization state x and the second polarization state y at one or more of $\lambda_{uv}$ and $\lambda_{bg}$.

As best illustrated in FIG. 2, a retarder layer 10 can be disposed between the reflective polarizer 30 and the display 80. Substantially incident white light 100 can be incident on the display system 300 at an incident angle θ1. The display system 300 reflects at least a portion of the incident white light 100, after the incident light is reflected at least twice by the display 80, as an exiting light 103 propagating at an exit angle θ2 substantially equal to the incident angle θ1. The substantially white incident light 100 can be reflected at least twice by the display 80 when, for example, the substantially white incident light 100 is reflected a first time by the display as a first reflected light 101 after being transmitted by the reflective polarizer 30 and the retarder layer 10, and the first reflected light 101 is reflected a second time by the display 80 as a second reflected light 102 after being reflected by the reflective polarizer 30 and transmitted at least once, such as twice, by the retarder layer 10, the second reflected light 102 exiting the display system as the exiting light 103.

In some implementations, the incident light 100 and the exiting light 103 have substantially the same color coordinates so that the exiting light 103 is substantially as white as the substantially white incident light 100. In such implementations, a maximum difference between corresponding CIE 1931 color chromaticity coordinates x and y of the incident light 100 and exiting light 103 is less than about 0.1, or less than about 0.1, at least when the incident angle θ1 is substantially equal to zero.

In some embodiments, the reflective polarizer 30 and the retarder layer 10 are disposed between a viewer 90 and the display 80.

In some embodiments, the substantially white incident light 100 is reflected a first time by the display 80 as a first reflected light 101 after being transmitted by the reflective polarizer 30 and the retarder layer 10. The first reflected light 101 can be reflected a second time by the display 80 as a second reflected light 102 after being reflected by the reflective polarizer 30 and transmitted at least once by the retarder layer 10. The second reflected light 102 can exit the display 80 as the exiting light 103. In various embodiments, a maximum difference between corresponding CIE 1931 color chromaticity coordinates x and y of the incident light 100 and exiting light 103 is less than, or less than about, 0.08, 0.06, 0.04 or 0.02 at least when the incident angle θ1 is substantially equal to zero.

In various embodiments, a maximum difference between corresponding CIE 1931 color chromaticity coordinates x and y of the incident light 100 and exiting light 103 is less than about 0.01 for at least one incident angle greater than about 20, about 30 or about 40 degrees.

In some embodiments, the display system 300 includes a retarder layer 10. As described in detail above, FIG. 4 illustrates a quarter wave relationship 50 as well as a retarder layer relationship 54, and a deviation Δ exists between the retarder layer relationship 54 and the quarter-wave relationship 50 at each given wavelength. In some embodiments, the retarder layer relationship 54 has a smaller deviation Δ from being a quarter-wave retarder 50 in the blue wavelength range 40 than in the red wavelength range 43. In some embodiments, this is exemplified by $\Delta_b$ being less than $\Delta_r$ and $\Delta_g$, where $\Delta_b$ is the deviation between the retarder layer relationship 54 and the quarter-wave relationship 50 within the blue wavelength range 40 at $\lambda_b$, $\Delta_r$ is the deviation between the retarder layer relationship 54 and the quarter-wave relationship 50 within the red wavelength range 43 at $\lambda_r$, and $\Delta_g$ is the deviation between the retarder layer relationship 54 and the quarter-wave relationship 50 within the green wavelength range 41 at $\lambda_g$. In some embodiments, this is exemplified by a deviation between the retarder layer relationship 54 and the quarter-wave relationship 50 being greater at all wavelengths within the blue wavelength range 40 than a deviation between the retarder layer relationship 54 and the quarter-wave relationship 50 at all wavelengths within the green wavelength range 41 and the red wavelength range 43.

The display system 300 can also include a reflective polarizer 30 and, for substantially normally incident light, for at least one wavelength in an infrared wavelength range 44, the reflective polarizer 30 can transmit at least 40%, 45%, 50%, 55%, 60%, 65%, 70%, 75% or 80% of the incident light having a first polarization state x and can reflect at least 40%, 45%, 50%, 55%, 60%, 65%, 70%, 75% or 80% of the incident light having an orthogonal, or substantially orthogonal, second polarization state y.

In some embodiments, for each wavelength in the red wavelength range 43, the reflective polarizer 30 transmits a portion of the incident light for each of the first and second polarization states x, y. In various embodiments, for each wavelength in the red wavelength range 43, the reflective polarizer 30 transmits at least 20%, 25%, 30%, 35%, 40%, 45%, 50%, 55% or 60% of the incident light for each of the first and second polarization states x, y.

A linear absorbing polarizer layer 20 can also be included with the display system 300. In some embodiments, the linear absorbing polarizer layer 20 has a greater average optical transmittance in the red wavelength range 43 than in the blue wavelength range 40 for the first polarization state x. In some embodiments, the linear absorbing polarizer layer 20 has a greater average optical transmittance in the red wavelength range 43 than in the blue wavelength range 40 for the second polarization state y.

Figure 5:
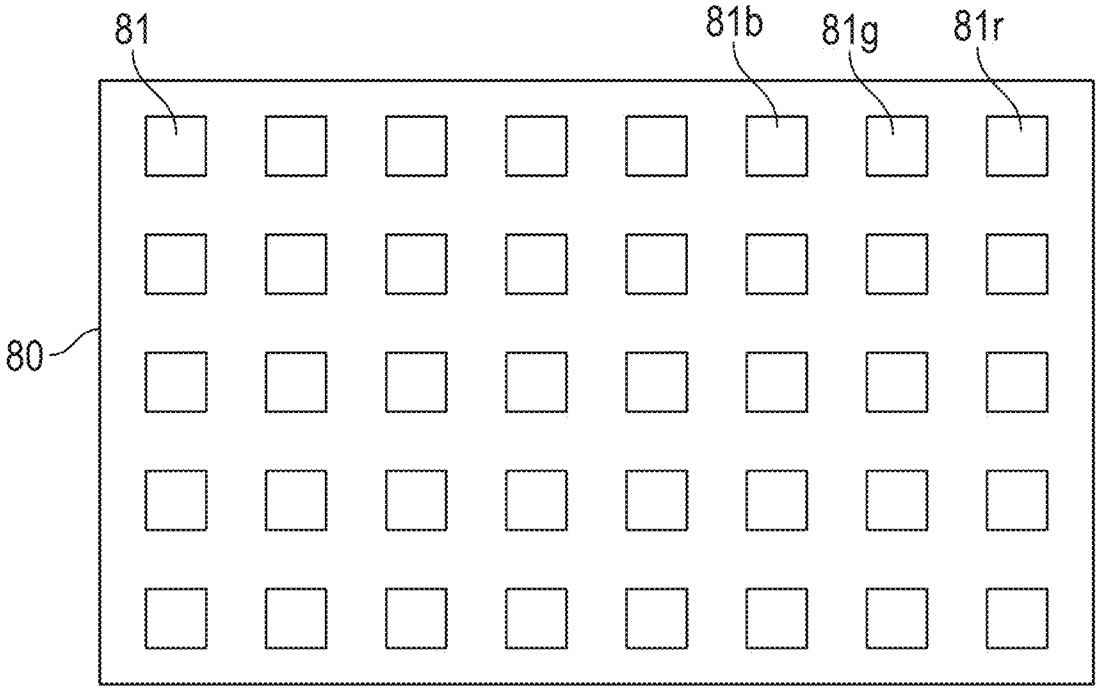
FIG. 5 is a schematic view of a display divided into a plurality of photosensitive pixels according to exemplary embodiments of the present disclosure.
Figure 6:
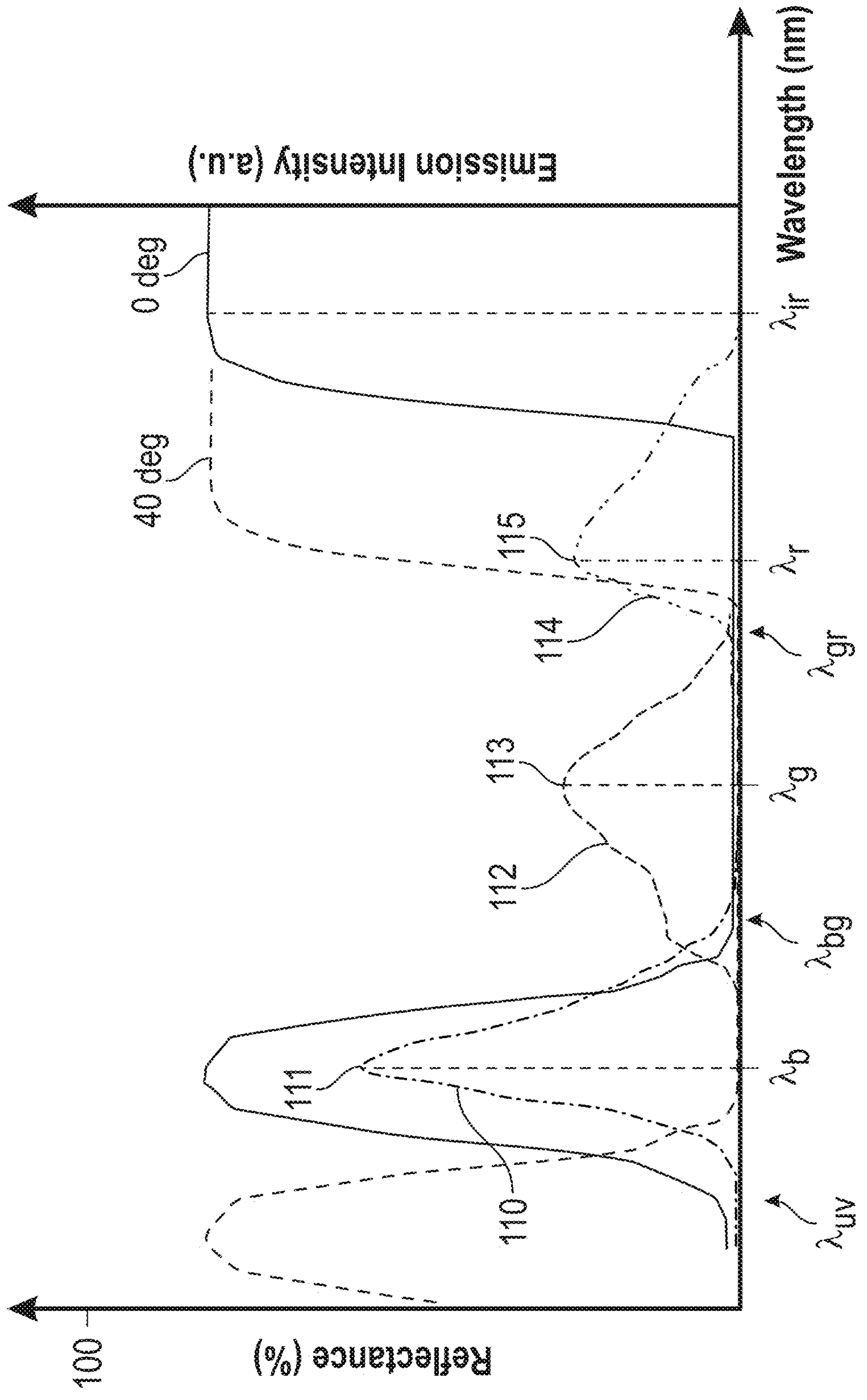
FIG. 6 is a plot of reflectance and emission intensity versus wavelength, and in particular illustrating blue, green and red light, according to exemplary embodiments of the present disclosure.

In some embodiments, and as illustrated in FIG. 1, the display system 300 includes a display 80 configured to emit an image 82 in a visible wavelength range, corresponding to, for example, the blue, green and red wavelength ranges 40, 41, 43, respectively. As best illustrated in FIG. 5, the display 300 can include a blue pixel 81*b* configured to emit blue light 110. In some embodiments, as shown in FIG. 6, the emitted blue light 110 has a blue peak 111 at an exemplary blue wavelength $\lambda_b$ in the visible wavelength range (40, 41, 43).

The display system 300 can include a linear absorbing polarizer layer 20 disposed on, proximate or adjacent the display 80, and a reflective polarizer 30 can be disposed between the linear absorbing polarizer layer 20 and the display 80. A retarder layer 10 can be disposed between, or substantially between, the reflective polarizer 30 and the display 80. As described above, FIG. 4 illustrates an exemplary deviation Δ between the retarder layer relationship 54 and the quarter-wave relationship 50 at a given wavelength.

In some embodiments, for substantially normally incident light, for an exemplary blue wavelength $\lambda_b$, the reflective polarizer 30 transmits at least a portion of light having a first polarization state x, and reflects at least a portion of light having a second polarization state y. In some embodiments, for substantially normally incident light, for an exemplary blue wavelength $\lambda_b$, the reflective polarizer 30 transmits at least 40%, 45%, 50%, 55%, 60%, 65%, 70%, 75% or 80% of light having a first polarization state x, and reflects at least 40%, 45%, 50%, 55%, 60%, 65%, 70%, 75% or 80% of light having a second orthogonal, or substantially orthogonal, polarization state y.

Exemplary wavelengths $\lambda_{uv}$ and $\lambda_b$ are shown in FIG. 4, and $\lambda_{uv}$ can be less than, or to the left along the x-axis of, $\lambda_b$. Further, in various embodiments, $\lambda_b$-$\lambda_{uv}$≤70, 65, 60, 55, 50, 45, 40, 35 or 30 nm. For each wavelength λ in the visible wavelength range, λ-$\lambda_b$≥70, 65, 60, 55, 50, 45, 40, 35 or 30 nm in various embodiments. In some embodiments, for at least the one wavelength $\lambda_{uv}$ and for each wavelength λ in the visible wavelength range 40, 41, 43, the reflective polarizer 30 transmits at least 20%, 25%, 30%, 35%, 40%, 45%, 50%, 55% or 60% of the incident light for each of the first and second polarization states x, y.

As described in detail above, FIG. 4 illustrates a quarter wave relationship 50 as well as a retarder layer relationship 54, and a deviation Δ exists between the retarder layer relationship 54 and the quarter-wave relationship 50 at each given wavelength. In some embodiments, deviation Δ is $\Delta_b$ at the wavelength $\lambda_b$, and deviation Δ is $\Delta_r$ at at least one red wavelength $\lambda_r$ in the visible wavelength range 40, 41, 43. In various embodiments, $\lambda_r$-$\lambda_b$≥80, 85, 90, 95, 100, 105, 110, 115 or 120 nm. In some embodiments, $\Delta_b \leq \Delta_r$.

Further, in some embodiments, for the first polarization state y, the linear absorbing polarizer 20 has a greater transmittance at the red wavelength $\lambda_r$ than at the blue wavelength $\lambda_b$. In some embodiments, the visible wavelength range extends from about 420 nm to about 650 nm.

In some embodiments, as best shown in FIGS. 1 and 5, a display system 300 includes an emissive display 80 including a blue pixel 81*b* configured to emit blue light 110, a green pixel 81*g* configured to emit green light 112 and a red pixel 81*r* configured to emit red light 114. As illustrated in FIG. 4, the blue light 100 can have a blue peak 111 at a blue wavelength $\lambda_b$, the green light 112 can have a green peak 113 at a green wavelength $\lambda_g$, and the red light 114 can have a red peak 115 at a red wavelength $\lambda_r$.

A reflective polarizer 30 can be disposed on the emissive display 80 and a retarder layer 10 can be disposed between, or substantially between, the reflective polarizer 30 and the emissive display 80. As described in detail above, FIG. 4 illustrates a quarter wave relationship 50 as well as a retarder layer relationship 54, and a deviation Δ exists between the retarder layer relationship 54 and the quarter-wave relationship 50 at a given wavelength.

For substantially normal incident light, for the blue wavelength $\lambda_b$ and for at least one infrared wavelength $\lambda_{ir}$, the reflective polarizer 30 can transmit a portion of the incident light having a first polarization state x and can reflect a portion of the incident light having an orthogonal second polarization state y. In some embodiments, for substantially normal incident light, for the blue wavelength $\lambda_b$ and for at least one infrared wavelength $\lambda_{ir}$, the reflective polarizer 30 can transmit at least 40%, 45%, 50%, 55%, 60%, 65%, 70%, 75% or 80% of the incident light having a first polarization state x and can reflect at least 40%, 45%, 50%, 55%, 60%, 65%, 70%, 75% or 80% of the incident light having an orthogonal second polarization state y. As described above, light having the first polarization state x can be polarized orthogonally, or substantially orthogonally, to light having the second polarization state y.

In some embodiments, for each of the green and red wavelengths $\lambda_g$ and $\lambda_r$, the reflective polarizer 30 transmits a portion of the incident light for each of the first and second polarization states x, y. In some embodiments, for each of the green and red wavelengths $\lambda_g$ and $\lambda_r$, the reflective polarizer 30 transmits at least 20%, 25%, 30%, 35%, 40%, 45%, 50%, 55% or 60% of the incident light for each of the first and second polarization states x, y.

As described above, FIG. 4 illustrates a quarter wave relationship 50 as well as a retarder layer relationship 54, and a deviation Δ exists between the retarder layer relationship 54 and the quarter-wave relationship 50 at a given wavelength. In some embodiments, deviation Δ is $\Delta_b$ at the wavelength $\lambda_b$, and deviation Δ is $\Delta_r$ at at least one red wavelength $\lambda_r$ in the visible wavelength range 40, 41, 43. In some embodiments, $\Delta_b \leq \Delta_r$. For light incident at at least one incident angle between about 10 and about 60 degrees, and for the red wavelength $\lambda_r$, the reflective polarizer 30 transmits at least 30%, 35%, 40%, 45%, 50%, 55%, 60%, 65% or 70% of light having the first polarization state x and reflects at least 30%, 35%, 40%, 45%, 50%, 55%, 60%, 65% or 70% of light having the second polarization state y in various embodiments.

In some embodiments, the emissive display is an Organic Light-Emitting Diode (OLED) display. In some embodiments, the emissive display is a Micro Light-Emitting Diode (μ-LED) display.

EXAMPLES

Example 1 and Comparative Example C1

A computational model was used to calculate reflection and transmission properties of a reflective polarizer. The computational model was driven by a 4×4 matrix solver routine based on the Berriman algorithm where the reflection and transmission matrix elements can be computed for an arbitrary stack of 1-dimensional layers, with each layer defined by its physical thickness and the by a dispersive refractive index tensor where each principal element of the refractive index tensor is a function of wavelength (λ). With this computational model, a 1-dimensional stack structure that represents an emissive display was defined and its reflection and transmission properties was computed.

A coordinate system for the computational model was defined, with a cartesian set of axes, x, y and z, shown in FIG. 1, where, for the purposes of the computational model, the x axis was as the "block axis", coincident with the high extinction axis of any absorbing polarizer and with the high-reflection axis of any reflective polarizer, and the y-axis was the "pass axis", coincident with the weakly absorbing, high transmission axis of the absorbing polarizer and the weakly reflecting axis of any reflective polarizer. The azimuthal angle φ was measured from the x-axis and the polar angle θ was measured from the z-axis.

With this computational stack model, the viewer-side reflection characteristics of an Organic LED (OLED) display was modelled with a stack structure of a glass layer (the exterior surface of the display) overtop a circular polarizer, composed of a display-quality iodine-type absorbing polarizer, overlaying a quarter-wave (λ/4) retarder, where the retarder had an extraordinary axis that lied midway between the principal in-plane axes of the absorbing polarizer. Further, underneath the retarder layer, was a dielectric layer, representing the thin-film encapsulant (TFE) which in turn overlaid an OLED emission surface including spatially organized array of voltage-driven blue, green and red emission "pixels" areas, surrounded by metallic-like transistor elements and conducting elements that function as the drivers for the emissive pixels that form the display.

Computation was performed with input from the computational stack model, to predict the degree of brightness increase of the intensity of the blue, green and red pixel emitted light from an OLED emission surface. These predictions were based on analysis of the stack-model-computed reflection and transmission coefficient spectra, coupled with an understanding of the reflection spectrum of the OLED emission surface. Analytic expressions were derived to predict pixel emission color and brightness change that results when a reflective polarizer is included in the circular polarizer of a modelled OLED display stack.

A multilayer optical film reflective polarizer was modeled that included a total of 44 optical repeat units (ORUs) that were modeled as being composed of alternating microlayers of 90/10 coPEN and low refractive index isotropic microlayers. The isotropic layers were modeled as being made as follows. A blend of polycarbonate and copolyesters (PCTg) is made as described in U.S. Pat. No. 10,185,068 (Johnson et al.) such that the index is about 1.57 and such that the layers remains substantially isotropic upon uniaxial orientation of the film. The PC:PCTg molar ratio is approximately 85 mol % PC and 15 mol % PCTg. The PC:PCTg is then blended with PETg at an 85:15 weight ratio ((PC:PCTg): PETg). The high index material, 90/10 coPEN, is referred to as material A, and the low index material is referred to as material B.

A thickness profile of microlayer A and B pairs, or ORUs, was mathematically generated. The phase thickness of the 1st A/B layer pair, is prescribed as $1/2\lambda_0$ (wavelength), wherein $\lambda_0$ is in the deep blue, at approximately 420 nm wavelength. Adjacent A/B ORUs had their physical thicknesses adjusted to have a phase thickness of $1/2\lambda_i$, where $\lambda_i$ was incrementally larger than $\lambda$. Further adjoining A/B layer pairs had their phase thickness adjusted to be $1/2\lambda_{i+1}$ and so on up through the entire optical film stack, until the last A/B layer pair is reached, with a phase thickness that was $1/2\lambda_N$, where $\lambda_N$ was approximately 580 nm. For this computational example, the film stack included a total of 44 A/B layer pairs, in a monotonic, non-linear A/B ORU profile. In addition, within each AB layer pair, both the A layer and B layer had an individual phase thickness that was $1/4\lambda_i$.

Figure 7:
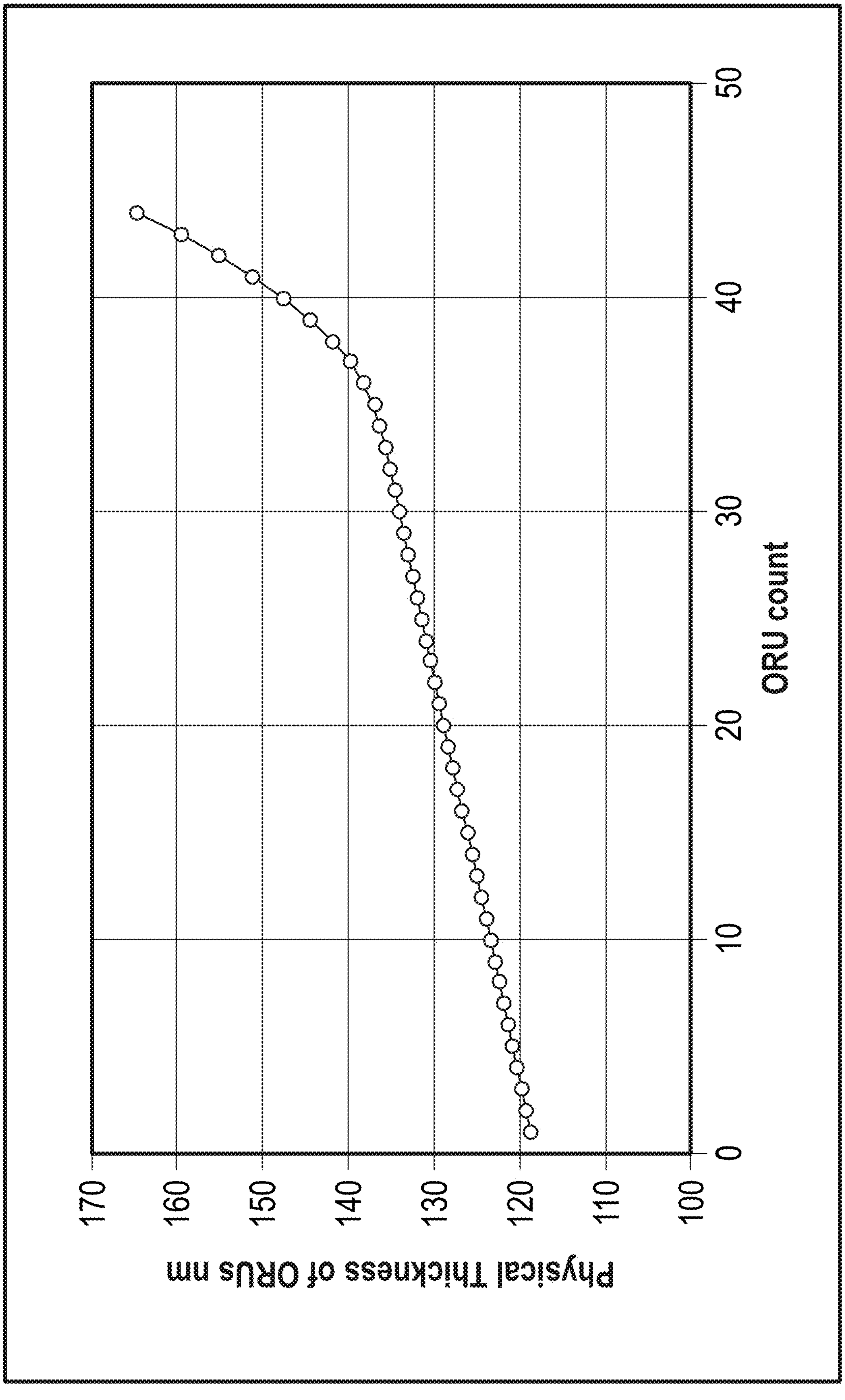
FIG. 7 is a plot of a thickness profile of optical repeat units in a first reflective polarizer.

The physical thickness profile for ORUs is shown in FIG. 7. The ORU thickness profile was bounded on both sides by a protective boundary layer of the low index material with a thickness of 1500 nm.

The OLED can include a blue pixel configured to emit blue light having a blue peak at a blue wavelength of about 450 nm, a green pixel configured to emit green light having a green peak at a green wavelength of about 530 nm, and a red pixel configured to emit red light having a red peak at a red wavelength of about 630 nm.

Representative values of the refractive index for the high index optical (HIO) layers (the birefringent 90/10 coPEN), denoted Nx, Ny, Nz along the x, y, z axes, respectively, and for the isotropic low index optical (LIO) layers (Niso is used to denote isotropic refractive indices), are shown in the following table:

| | HIO | | | LIO |
|---|---|---|---|---|
| λ | Nx | Ny | Nz | Niso |
| 450 nm | 1.9222 | 1.6087 | 1.5987 | 1.5962 |
| 530 nm | 1.8611 | 1.5794 | 1.5696 | 1.5801 |
| 630 nm | 1.8266 | 1.5651 | 1.5554 | 1.5701 |

Further, the model set-up defined a 400 micrometer glass layer followed by a display absorbing polarizer above the multilayer optical film reflective polarizer. The refractive indices for glass and the dielectric layer immediately above the OLED emission surface are shown in the following table.

| λ | Glass Niso | Dielectric Niso |
|---|---|---|
| 450 nm | 1.5252 | 1.5057 |
| 530 nm | 1.5195 | 1.4987 |
| 630 nm | 1.5151 | 1.4937 |

The absorbing polarizer was modelled after a Sanritz display polarizer and assumed to be 10 micrometers thick. The refractive index (Niso) and the loss (Kx, Ky, Kz) for the absorbing polarizer are shown in the following table.

| | Absorbing Polarizer | | | |
|---|---|---|---|---|
| λ | Niso | Kx | Ky | Kz |
| 450 nm | 1.5043 | 3.527E−02 | 7.367E−04 | 7.367E−04 |
| 530 nm | 1.4983 | 4.387E−02 | 4.732E−04 | 4.732E−04 |
| 630 nm | 1.4953 | 5.242E−02 | 5.084E−04 | 5.084E−04 |

In the model, a quarter-wave retarder layer was situated below the reflective polarizer, with its extraordinary axis No, aligned midway at 45 degrees between the x-axis and the y-axis. The refractive index values for the retarder are shown in the following table, as are the deviation values Δ (in nanometers) from quarter-wave, at the representative wavelengths. Comparative Example C1 used a retarder that was approximately quarter wave at a green wavelength and Example 1 used a retarder that was approximately quarter wave at a blue wavelength. These retarder properties were manipulated in the model by changing the retarder thickness.

| | Retarder | | | Comp. Ex. C1 | Ex. 1 |
|---|---|---|---|---|---|
| λ | Ne | No | No | Δ | Δ |
| 450 nm | 1.5043 | 1.4903 | 1.4903 | 24.13 | 0.33 |
| 530 nm | 1.4983 | 1.4843 | 1.4843 | 4.48 | 19.32 |
| 630 nm | 1.4953 | 1.4813 | 1.4813 | 21.37 | 45.17 |

The OLED emission surface was defined in the model as having metal-like phase rotation properties upon reflection and with reflection coefficient values shown in the following table.

| λ | Refl. coef. |
|---|---|
| 450 nm | 0.3336 |
| 530 nm | 0.4895 |
| 630 nm | 0.5570 |

The absorption coefficients for all of the layers in the OLED model, except for the absorbing polarizer, were taken to be insignificantly small.

Figure 8:
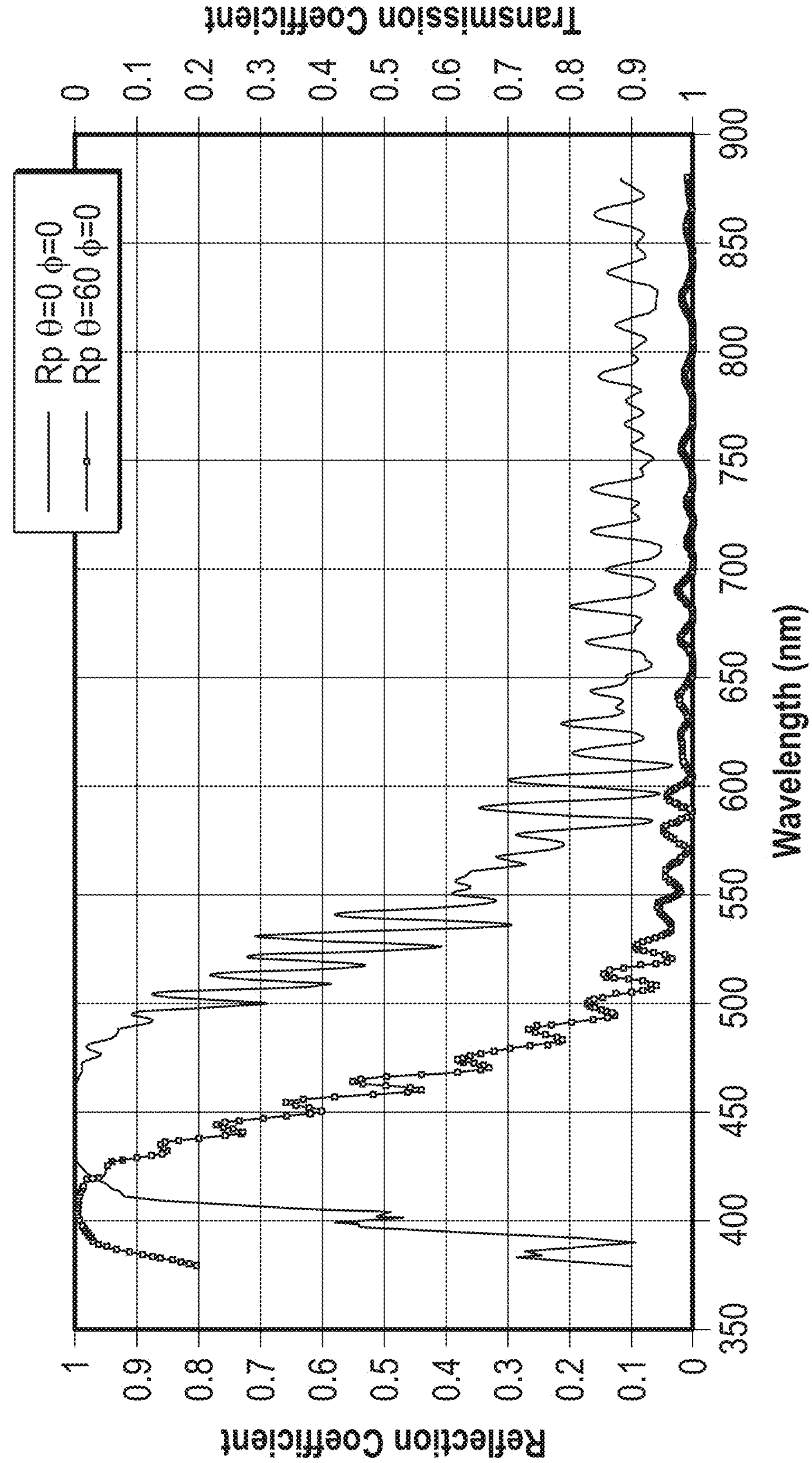
FIGS. 8-9 are plots of reflection coefficients (left vertical axis) and transmission coefficients (right vertical axis) for the first reflective polarizer for normal incidence and for a 60 degree angle of incidence.
Figure 9:
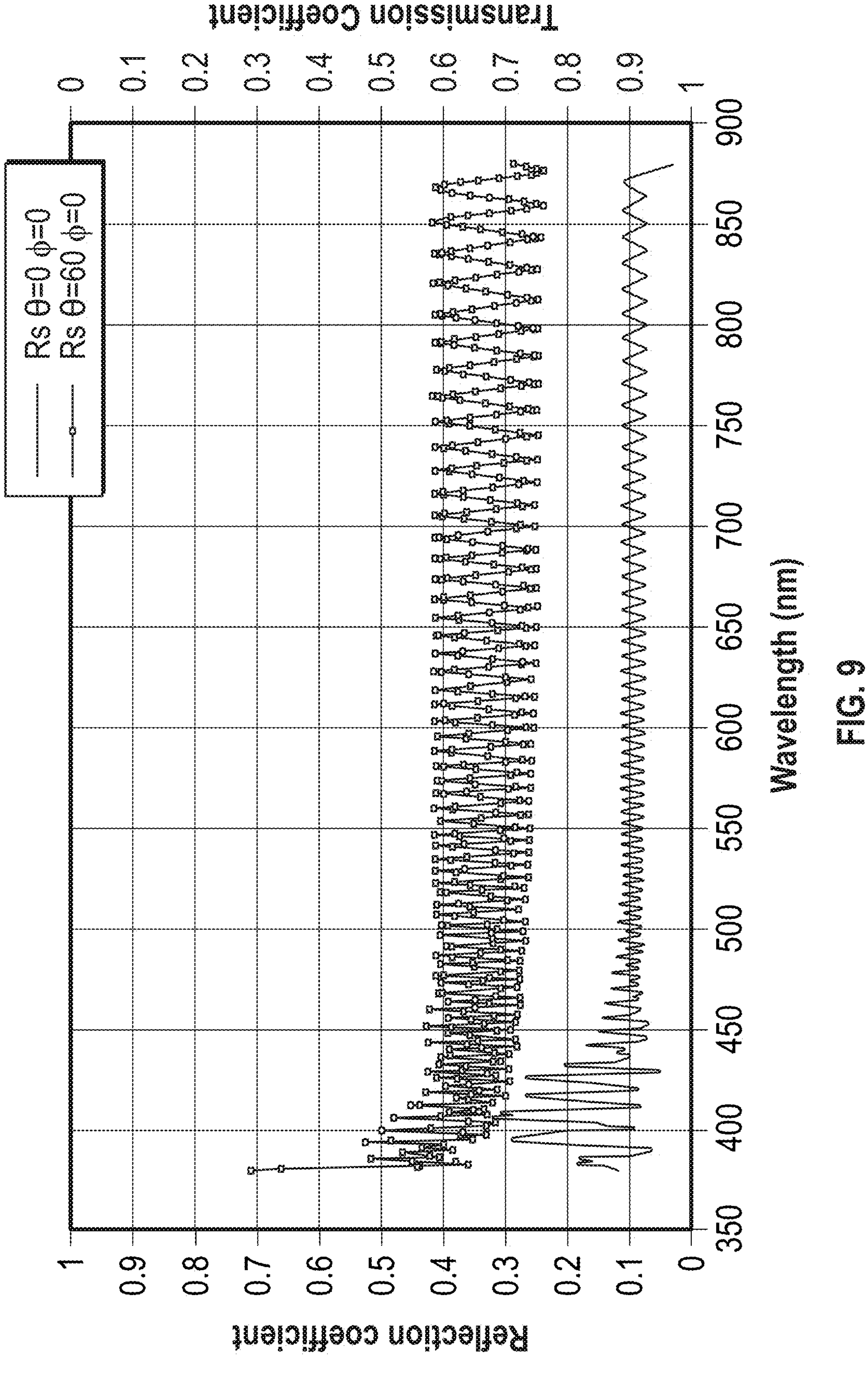

FIGS. 8-9 show the computed reflection coefficient (fraction of incident that is light reflected) for the multilayer optical film reflective polarizer in air for electric field aligned with the x-axis and the y-axis, respectively, and for polar angles of 0 degrees and 60 degrees.

Figure 10:
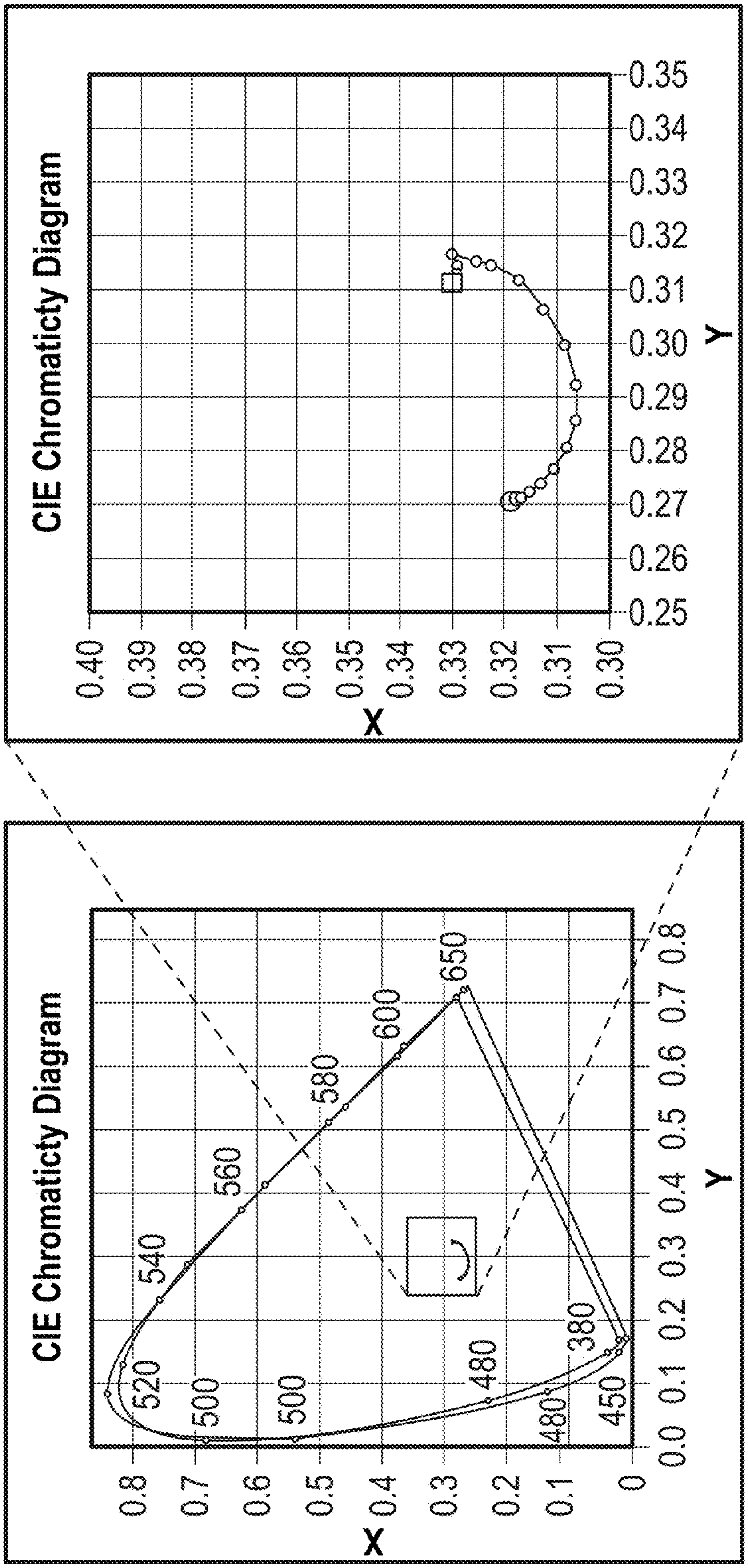
FIGS. 10-11 are chromaticity plots for ambient reflection from circular polarizers incorporating the first reflective polarizer for varying angle of incidence.
Figure 11:
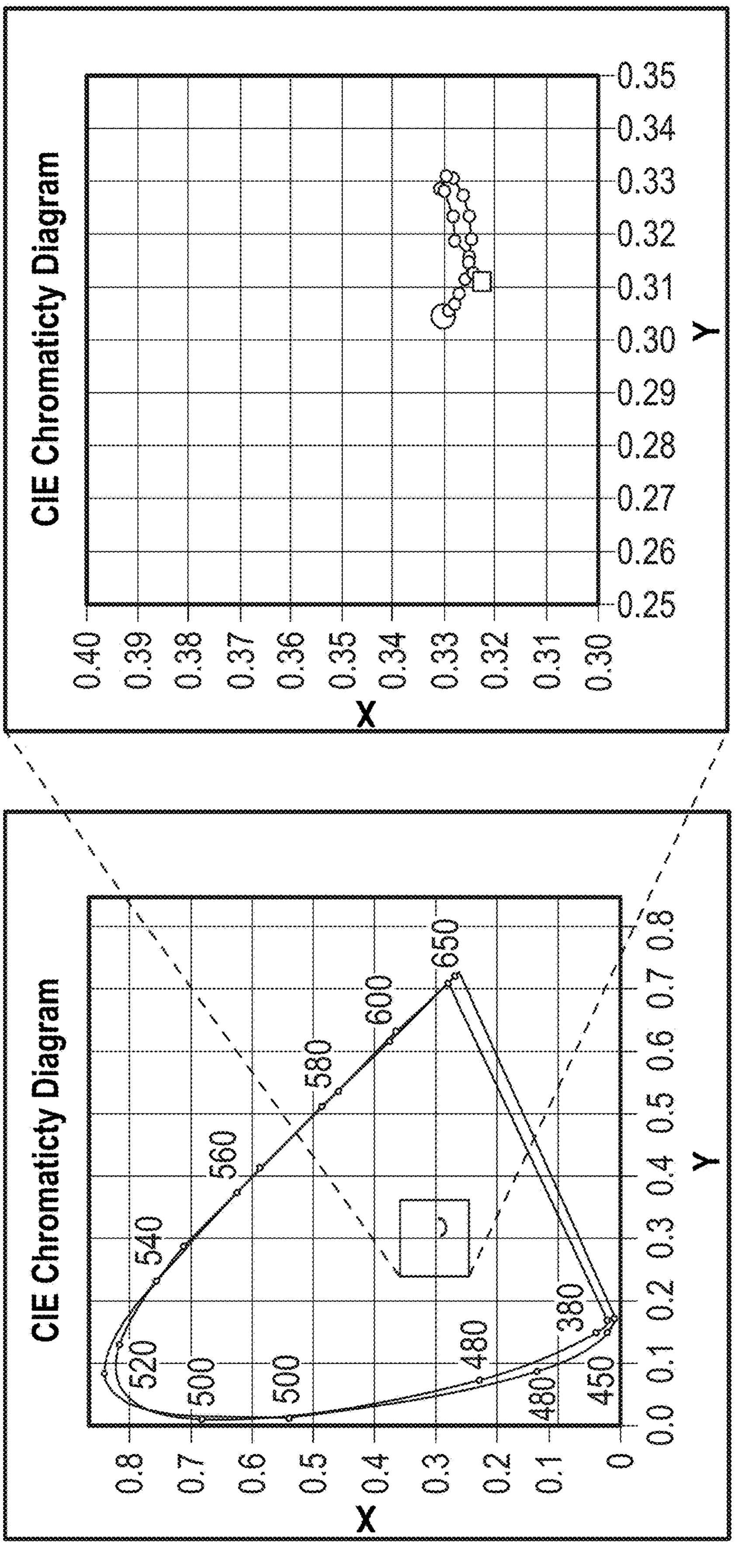

The computational model was set up to compute the ambient reflection for the circular polarizer. A D65 light source was incorporated in the computation. The CIE 1931 xy chromaticity coordinates for the D65 light source was x=0.3127 and y=0.3291. The normal incidence photopic reflectance for ambient D65 incident light was 7.66%. Chromaticity plots for the reflected light were computed and are shown in FIGS. 10-11 for Comp. Ex. C1 and Example 1, respectively, for polar angles from zero to 85 degrees. The square represents the chromaticity coordinates for the D65 light source. The larger circle represents the is the chromaticity coordinates for a polar angle of zero degrees. The circular polarizer of Example 1 had a near-normal angle reflected color that was nearly the same as the D65 color point, with CIE x and y color coordinates within a distance of about 0.10 from the D65 color coordinates.

Example 2 and Comparative Example C2

Figure 12:
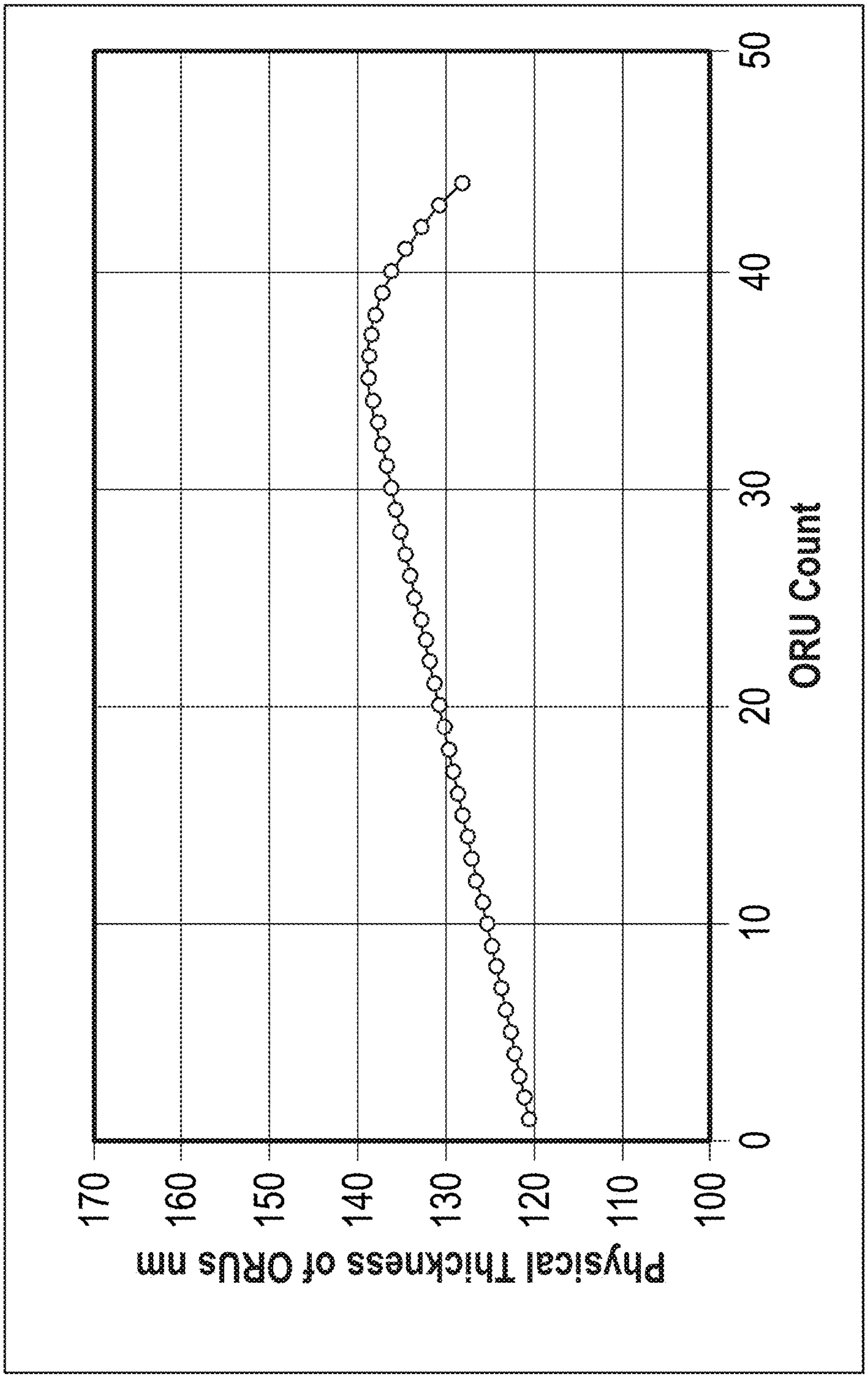
FIG. 12 is a plot of a thickness profile of optical repeat units in a second reflective polarizer.

A reflective polarizer and circular polarizers including the reflective polarizer were modeled as in Example 1 and Comparative Example C1 for Example 2 and Comparative Example C2, respectively, except that the physical thickness of the optical repeat units used in the reflective polarizer had the physical thickness profile depicted in FIG. 12.

Figure 13:
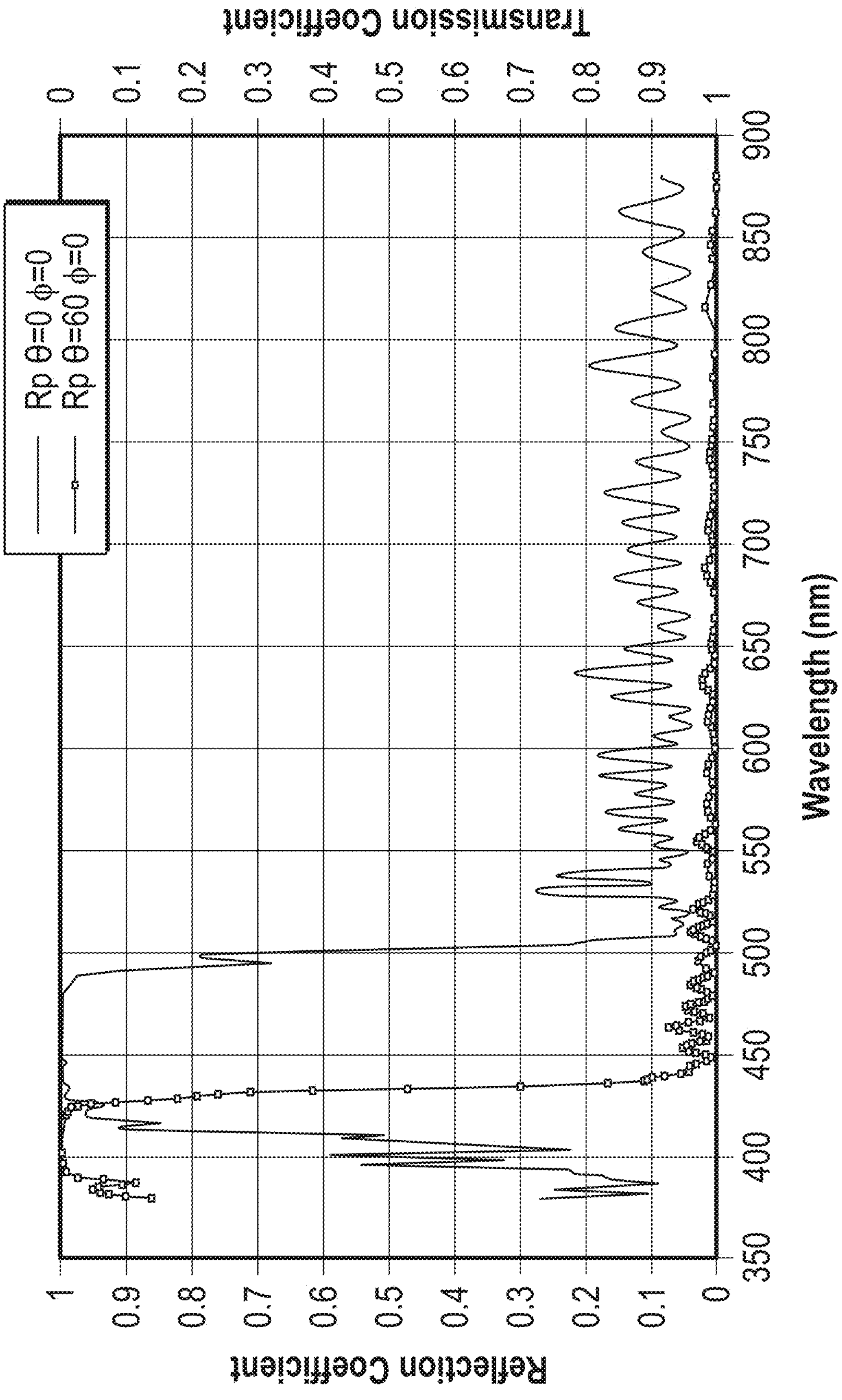
FIGS. 13-14 are plots of reflection coefficients (left vertical axis) and transmission coefficients (right vertical axis)
Figure 14:
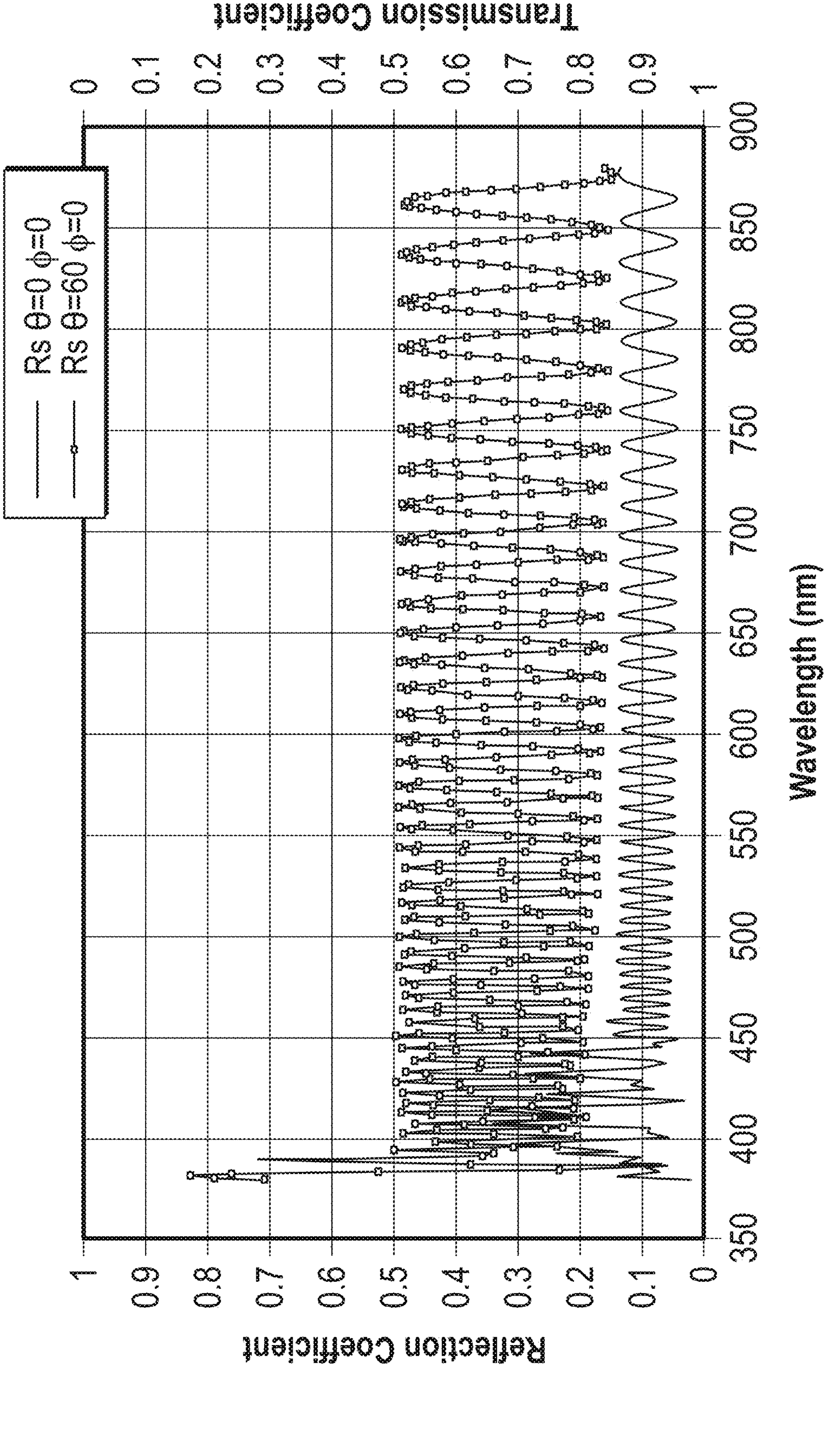

FIGS. 13-14 show the computed reflection coefficient for the multilayer optical film reflective polarizer in air for electric field aligned with the x-axis and the y-axis, respectively, and for polar angles of 0 degrees and 60 degrees.

The computational model was set up to compute the ambient reflection for the circular polarizer as described for Example 1. The normal incidence photopic reflectance for ambient D65 incident light was 6.81%. Chromaticity plots for the reflected light were computed and are shown in FIGS. 15-16 for Comp. Ex. C2 and Example 2, respectively, for polar angles from zero to 85 degrees. The square represents the chromaticity coordinates for the D65 light source. The larger circle represents the is the chromaticity coordinates for a polar angle of zero degrees.

Example 3 and Comparative Example C3

A reflective polarizer and circular polarizers including the reflective polarizer were modeled as in Example 1 and Comparative Example C1 for Example 3 and Comparative Example C3, respectively, except that the number of optical repeat units used in the reflective polarizer was reduced to 24 and the physical thickness of the optical repeat units had the physical thickness profile depicted in FIG. 17.

FIGS. 18-19 show the computed reflection coefficient for the multilayer optical film reflective polarizer in air for electric field aligned with the x-axis and the y-axis, respectively, and for polar angles of 0 degrees and 60 degrees.

The computational model was set up to compute the ambient reflection for the circular polarizer as described for Example 1. The normal incidence photopic reflectance for ambient D65 incident light was 8.06%. Chromaticity plots for the reflected light were computed and are shown in FIGS. 20-21 for Comp. Ex. C3 and Example 3, respectively, for polar angles from zero to 85 degrees. The square represents the chromaticity coordinates for the D65 light source. The larger circle represents the is the chromaticity coordinates for a polar angle of zero degrees. The circular polarizer of Example 3 had a near-normal angle reflected color that was nearly the same as the D65 color point, with CIE x and y color coordinates having a distance less than about 0.10 from the D65 color coordinates.

Example 4 and Comparative Example C4

A reflective polarizer and circular polarizers including the reflective polarizer were modeled as in Example 1 and Comparative Example C1 for Example 4 and Comparative Example C4, respectively, except that the number of optical repeat units used in the reflective polarizer was reduced to 32 and the physical thickness of the optical repeat units had the physical thickness profile depicted in FIG. 22.

FIGS. 23-24 show the computed reflection coefficient for the multilayer optical film reflective polarizer in air for electric field aligned with the x-axis and the y-axis, respectively, and for polar angles of 0 degrees and 60 degrees.

The computational model was set up to compute the ambient reflection for the circular polarizer as described for Example 1. The normal incidence photopic reflectance for ambient D65 incident light was 8.06%. Chromaticity plots for the reflected light were computed and are shown in FIGS. 25-26 for Comp. Ex. C4 and Example 4, respectively, for polar angles from zero to 85 degrees. The square represents the chromaticity coordinates for the D65 light source. The larger circle represents the is the chromaticity coordinates for a polar angle of zero degrees.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 5 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.95 and 1.05, and that the value could be 1.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A display system, comprising:

a display including a plurality of pixels and configured to emit an image for viewing by a viewer;

a reflective polarizer disposed on the display, for an incident light at an incident angle of about 0 degrees:

for a primary wavelength $\lambda_b$, the reflective polarizer transmitting at least 60% of the incident light having a first polarization state and reflecting at least 60% of the incident light having an orthogonal second polarization state; and for each of a first wavelength $\lambda_{uv}$ and a second wavelength $\lambda_{bg}$, $0<\lambda_b-\lambda_{uv}\leq 100$ nm and $0<\lambda_{bg}-\lambda_b\leq 100$ nm, the reflective polarizer transmitting at least 40% of the incident light for each of the first and second polarization states; and a retarder layer disposed between the reflective polarizer and the display, such that when a D65 incident light from a D65 illuminant is incident on the display system at an incident angle θ1, the display system reflects at least a portion of the D65 incident light, after the D65 incident light is reflected at least twice by the display, as an exiting light propagating at an exit angle θ2 about equal to the incident angle θ1, a maximum difference between corresponding CIE 1931 color chromaticity coordinates x and y of the D65 incident light and the exiting light being less than about 0.06 for at least one incident angle less than about 20 degrees.

2. The display system of claim 1, wherein the reflective polarizer and the retarder layers are disposed between the viewer and the display.

3. The display system of claim 1, wherein the D65 incident light is reflected a first time by the display as a first reflected light after being transmitted by the reflective polarizer and the retarder layers, and the first reflected light is reflected a second time by the display as a second reflected light after being reflected by the reflective polarizer and transmitted at least once by the retarder layer, the second reflected light exiting the display as the exiting light.

4. The display system of claim 1, wherein the display is an organic light emitting display (OLED).

5. The display system of claim 1, wherein the maximum difference between corresponding CIE 1931 color chromaticity coordinates x and y of the D65 incident light and the exiting light is less than about 0.04 for at least one incident angle less than about 20 degrees.

6. The display system of claim 1, wherein the maximum difference between corresponding CIE 1931 color chromaticity coordinates x and y of the D65 incident light and the exiting light is less than about 0.02 for at least one incident angle less than about 20 degrees.

7. The display system of claim 1, wherein the maximum difference between corresponding CIE 1931 color chromaticity coordinates x and y of the D65 incident light and the exiting light is less than about 0.1 for at least one incident angle greater than about 20 degrees.

8. The display system of claim 1, wherein the maximum difference between corresponding CIE 1931 color chromaticity coordinates x and y of the D65 incident light and the exiting light is less than about 0.1 for at least one incident angle greater than about 30 degrees.

9. A display system, comprising:

a display configured to emit an image in a visible wavelength range, the display including a blue pixel configured to emit blue light, the emitted blue light having a blue peak at a blue wavelength $\lambda_b$ in the visible wavelength range;

a linear absorbing polarizer layer disposed on the display;

a reflective polarizer disposed between the linear absorbing polarizer layer and the display; and a retarder layer disposed between the reflective polarizer and the display and having a deviation Δ from being a quarter-wave retarder, wherein for a wavelength in a blue wavelength range, the retarder layer has a retardance of about a quarter of the wavelength; such that for an incident light at an incident angle of about 0 degrees:

for the blue wavelength $\lambda_b$, the reflective polarizer transmits at least 60% of light having a first polarization state and reflects at least 60% of light having an orthogonal second polarization state;

for at least one wavelength $\lambda_{uv}$ less than $\lambda_b$, $\lambda_b$-$\lambda_{uv}$≤50 nm, and for each wavelength λ in the visible wavelength range, λ-$\lambda_b$≥50 nm, the reflective polarizer transmits at least 40% of the incident light for each of the first and second polarization states;

Δ is $\Delta_b$ at the wavelength $\lambda_b$, and $\Delta_r$ at at least one red wavelength $\lambda_r$ in the visible wavelength range, $\lambda_r$-$\lambda_b$≥100 nm, $\Delta_b$≤$\Delta_r$; and for the first polarization state, the linear absorbing polarizer has a greater transmittance at the red wavelength $\lambda_r$ than the blue wavelength $\lambda_b$.

10. The display system of claim 9, wherein the visible wavelength range extends from about 420 nm to about 650 nm.

11. The display system of claim 9, wherein the reflective polarizer is bonded to the retarder and linear absorbing polarizer layers by respective first and second adhesive layers.

12. The display system of claim 9, wherein the display is an organic light emitting display (OLED).

13. The display system of claim 9, wherein the display is a micro light emitting diode (μ-LED) display.

* * * * *